US012684988B2

(12) United States Patent
Lu et al.

(10) Patent No.: US 12,684,988 B2
(45) Date of Patent: Jul. 14, 2026

(54) DISPLAY PANEL AND DISPLAY DEVICE

(71) Applicant: Hubei Yangtze Industrial Innovation Center of Advanced Display Co., LTD., Wuhan (CN)

(72) Inventors: Feng Lu, Shanghai (CN); Quanpeng Yu, Shanghai (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 617 days.

(21) Appl. No.: 17/989,443

(22) Filed: Nov. 17, 2022

(65) Prior Publication Data

US 2024/0074279 A1     Feb. 29, 2024

(30) Foreign Application Priority Data

Aug. 26, 2022    (CN) ......................... 202211033725.1

(51) Int. Cl.
| | |
|---|---|
| *H10K 59/40* | (2023.01) |
| *G06F 3/041* | (2006.01) |
| *G06F 3/044* | (2006.01) |
| *H10K 59/12* | (2023.01) |

(52) U.S. Cl.
CPC ........... *H10K 59/40* (2023.02); *G06F 3/0412* (2013.01); *G06F 3/0443* (2019.05); *G06F 2203/04111* (2013.01); *G06F 2203/04112* (2013.01); *H10K 59/12* (2023.02)

(58) Field of Classification Search
CPC ............. G06F 2203/0338; G06F 21/32; G06F 2203/04112; G06F 3/0412; G06F 3/0443; G06F 3/0446
See application file for complete search history.

(56) References Cited

U.S. PATENT DOCUMENTS

| | | | |
|---|---|---|---|
| 2021/0028252 A1* | 1/2021 | Hong | ................... H10K 59/126 |
| 2021/0200360 A1* | 7/2021 | Lee | ....................... G06F 3/0443 |
| 2022/0328591 A1* | 10/2022 | Sun | ..................... H10K 50/865 |

FOREIGN PATENT DOCUMENTS

CN        110890412 A        3/2020

* cited by examiner

*Primary Examiner* — Robin J Mishler

(74) *Attorney, Agent, or Firm* — Anova Law Group, PLLC

(57) ABSTRACT

Display panel and display device are provided. The display panel includes a first display area having a light-transmitting area. The display panel further includes a display function layer including light-emitting elements; auxiliary structures on a side of the display function layer facing a display surface of the display panel; and the auxiliary structures configured around pixels in the first display area.

20 Claims, 13 Drawing Sheets

1000

100

DISPLAY PANEL AND DISPLAY DEVICE

CROSS-REFERENCE TO RELATED APPLICATION

This application claims priority of Chinese Patent Application No. 202211033725.1, filed on Aug. 26, 2022, the entire contents of which are hereby incorporated by reference.

FIELD OF THE DISCLOSURE

The present disclosure generally relates to the field of display technology and, more particularly, relates to a display panel and a display device.

BACKGROUND

With a continuous development of display technology, a full screen has become a mainstream display screen design, and the full screen is a display screen with an ultra-high screen-to-body ratio. To make the display screen have a higher screen-to-body ratio, a camera under panel (CUP) technology is being paid attention by more and more manufacturers. In the CUP technology, optical devices such as cameras are arranged on a back of a display area of the display screen, and an area where the cameras and optical sensors are arranged may be called a CUP area. The CUP area can not only display the screen, but also transmit lights required by the cameras. How to improve a display effect of the display screen with under-screen cameras has become an urgent problem to be solved.

BRIEF SUMMARY OF THE DISCLOSURE

One aspect of the present disclosure provides a display panel. The display panel includes a first display area having a light-transmitting area. The display panel further includes a display function layer including light-emitting elements; auxiliary structures on a side of the display function layer facing a display surface of the display panel; and the auxiliary structures configured around pixels in the first display area.

Another aspect of the present disclosure provides a display device. The display device includes a display panel. The display panel includes a first display area having a light-transmitting area. The display panel further includes a display function layer including light-emitting elements; auxiliary structures on a side of the display function layer facing a display surface of the display panel; and the auxiliary structures configured around pixels in the first display area.

Other aspects of the present disclosure can be understood by a person skilled in the art in light of the description, the claims, and the drawings of the present disclosure.

DETAILED DESCRIPTION

Figure 1:
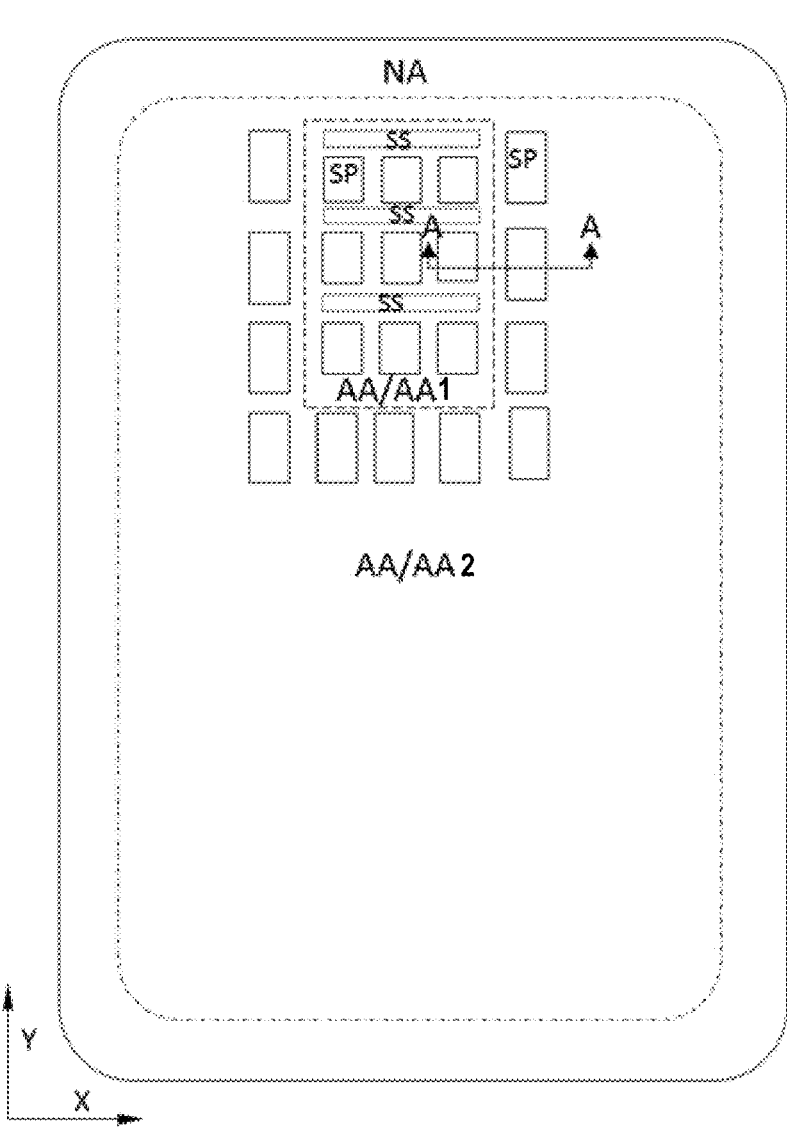
FIG. 1 illustrates a top view of a display panel consistent with various embodiments of the present disclosure.

To make the above objects, features, and advantages of the present disclosure more apparent and easier to understand, the present disclosure will be further described below with reference to accompanying drawings and embodiments.

It should be noted that specific details are set forth in the following description to facilitate a thorough understanding of the present disclosure. However, the present disclosure can be implemented in many other ways different from those described herein, and a person skilled in the art can make similar improvements without departing from the connotation of the present disclosure. Therefore, the present disclosure will not be limited by the specific embodiments disclosed below.

The terms used in the embodiments of the present disclosure are only for a purpose of describing specific embodiments and are not intended to limit the present disclosure. As used in the embodiments of the present disclosure and appended claims, the terms "a," "the," and "said" are intended to include, unless the context clearly dictates otherwise, plural alternatives as well.

It should be noted that directional words such as "up", "down", "left", "right" described in the embodiments of the present disclosure are described from angles shown in the accompanying drawings and should not be construed as limitations on the embodiments. In addition, in the context, it will also be understood that when it is mentioned that an element is formed "on" or "under" another element, it can not only be directly formed "on" or "under" the other element, but also be indirectly formed "on" or "under" the other element through intervening elements.

Also, exemplary embodiments can be implemented in various forms and should not be construed as limited to the embodiments set forth herein. Rather, the embodiments are provided so that the present disclosure will be thorough and will fully convey the concept of exemplary embodiments to a person skilled in the art. Same reference numerals in the accompanying drawings denote same or similar structures, so repeated descriptions will be omitted. The words expressing positions and directions described in the present disclosure are all described by taking the accompanying drawings as examples, but changes can also be made as required, and the changes are all included in the protection scope of the present disclosure. The accompanying drawings of the present disclosure are only used to illustrate relative positional relationships, and layer thicknesses of some parts are drawn in an exaggerated manner to facilitate understanding, and the layer thicknesses in the accompanying drawings do not represent proportional relationships of the actual layer thicknesses. When there is no conflict, the embodiments of the present disclosure and the features of the embodiments may be combined with each other. The accompanying drawings of various embodiments in the specification use same reference numerals. In addition, similar features between the embodiments will not be repeated.

Figure 2:
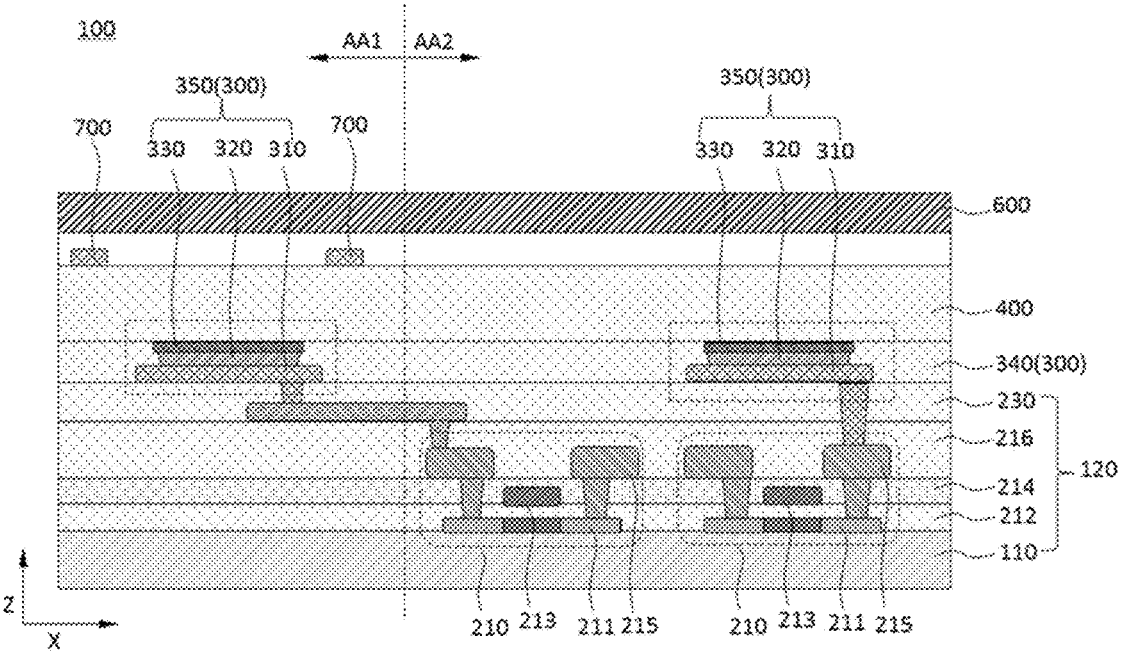
FIG. 2 illustrates a partial cross-sectional view along a direction A-A in FIG. 1.
Figure 3:
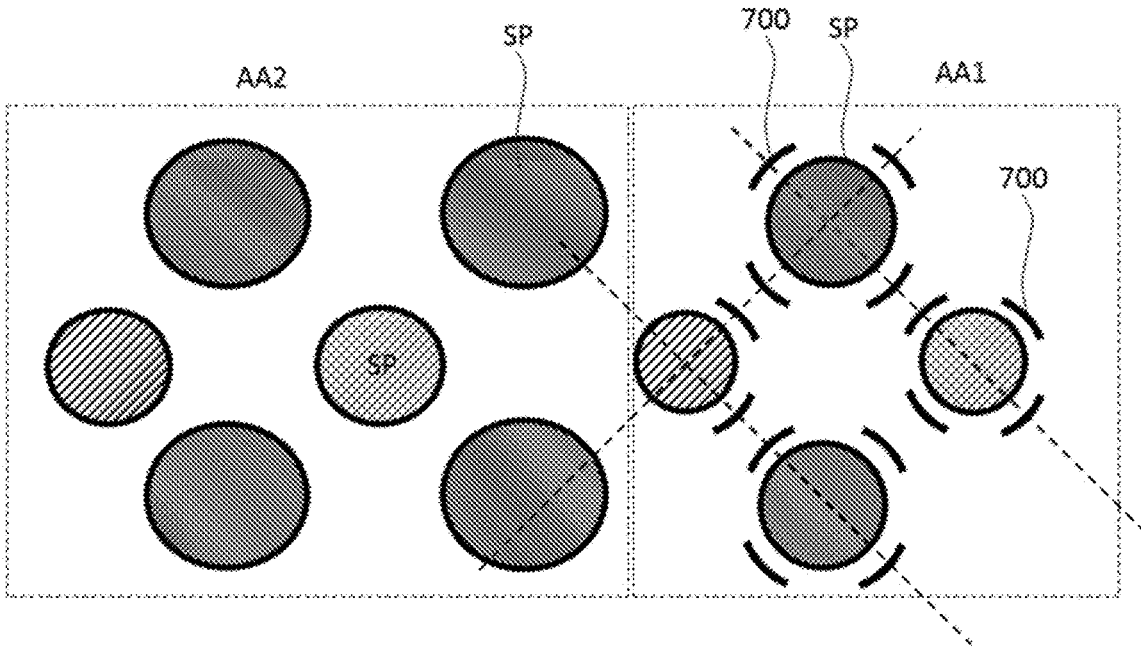
FIG. 3 illustrates a partially enlarged top view of a display panel consistent with various embodiments of the present disclosure.

FIG. 1 illustrates a top view of a display panel consistent with various embodiments of the present disclosure. FIG. 2 illustrates a partial cross-sectional view along a direction A-A in FIG. 1. FIG. 3 illustrates a partially enlarged top view of a display panel consistent with various embodiments of the present disclosure.

Optionally, a display panel 100 is divided into a display area AA and a non-display area NA surrounding the display area AA. A dash-dot line box in FIG. 1 is used to indicate a boundary between the display area AA and the non-display area NA. The display area AA is an area of the display panel used for displaying images, and usually includes a plurality of pixels SP arranged in an array. The plurality of pixels SP includes corresponding light-emitting elements (e.g., diodes), control elements (e.g., thin films transistors that make up the pixel drive circuits). The non-display area NA surrounds the display area AA, and usually includes peripheral driving elements, peripheral wirings, and a fan-out area.

Optionally, the display panel includes a first display area AA1. Specifically, the first display area AA1 is part of the display area AA. Optionally, the first display area AA1 has a light-transmitting area SS. Therefore, the first display area AA1 has a higher transmittance to an external light. An area where the first display area AA1 is located may be used for arranging elements with optical functions. For example, cameras, fingerprint identification structures, and other devices integrated with light sensors may be arranged below the first display area AA1. In addition to a function of light-emitting display, the first display area AA1 can also realize functions of optical signal transmission, such as at least one of functions such as photographing and biometric identification.

Optionally, the display panel may further include a second display area AA2.

Optionally, the second display area AA2 is also part of the display area AA.

Specifically, the display area AA includes the first display area AA1 and the second display area AA2 that may be adjacent to each other. A light transmittance of the second display area AA2 is smaller than a light transmittance of the first display area AA1. That is, the first display area AA1 and the second display area AA2 are different areas in the display area AA, and the first display area AA1 has a higher transmittance to an external light than the second display area AA2. In addition, the second display area AA2 may at least partially surround the first display area AA1.

As shown in FIG. 1, the second display area AA2 can fully surround the first display area AA1. In some other optional embodiments, the second display area AA2 may also partially surround the first display area AA1. The first display area AA1 may be one of any shapes such as a circle, an ellipse, and a rectangle.

Optionally, the display panel 100 includes a display function layer 800. The display function layer 800 includes light-emitting elements 350. Specifically, the display function layer 800 includes a array substrate 120, a light-emitting function layer 300 and an encapsulation layer 400 which are stacked in sequence.

Optionally, the array substrate 120 includes the substrate 110.

Optionally, the substrate 110 may be made of polymer materials such as glass, polyimide (PI), polycarbonate (PC), polyethersulfone (PES), polyethylene terephthalate (PET), polyethylene naphthalate (PEN), polyaryl (PAR) or fiberglass reinforced plastic (FRP). The substrate 110 may be transparent, translucent, or opaque.

Optionally, the substrate 110 may be soft or rigid. It should be noted that when a specific film layer is "on" a specific reference film layer in the embodiments of the present specification, it can be understood that the reference film layer is "on a side away from the substrate". Unless otherwise specified, "up" only indicates an azimuth relationship, and does not mean that the two film layers are necessarily adjacent or contacting film layers.

Optionally, the array substrate 120 may further include a buffer layer (not shown) on the substrate 110, and the buffer layer may cover an entire upper surface of the substrate 110.

Optionally, the array substrate 120 further includes pixel circuits and a driving module for controlling light-emitting elements 350.

Specifically, the array substrate 120 includes a plurality of pixel circuits in the display area AA and a driving module in the non-display area NA. Optionally, the plurality of pixel circuits and the driving module are on a side of the substrate 110 facing a display surface or a touch surface of the display panel 100.

The array substrate 120 may further include a plurality of thin film transistors (TFT), and pixel circuits composed of thin film transistors for controlling light emissions of the light-emitting elements 350.

In one embodiment, a top-gate thin film transistor layer is taken as an example for structural description. A thin film transistor layer 210 includes an active layer 211 on the substrate 110. The active layer 211 may be made of an amorphous silicon material, a polysilicon material, a metal oxide material, or the like. When the active layer 211 is made of polycrystalline silicon material, the active layer 211 can be formed by using a low temperature amorphous silicon technology, i.e., the amorphous silicon material is melted by a laser to form a polycrystalline silicon material. In addition, the active layer 211 can be formed by another method such as rapid thermal annealing (RTA), solid phase crystallization (SPC), excimer laser annealing (ELA), metal-induced crystallization (MIC), metal-induced lateral crystallization (MILC), or continuous lateral solidification (SLS). The active layer 211 further includes a source region and a drain region formed by doping N-type impurity ions or P-type impurity ions, and a channel region between the source and drain regions.

The thin film transistor layer 210 also includes a gate insulating layer 212 on the active layer 211. The gate insulating layer 212 includes inorganic layers made of silicon oxide or silicon nitride. The inorganic layers may include a single layer or a plurality of layers.

The thin film transistor layer 210 also includes a gate 213 on the gate insulating layer 212. The gate 213 may include a single layer or a plurality of layers of gold (Au), silver (Ag), copper (Cu), nickel (Ni), platinum (Pt), palladium (Pd), aluminum (Al), molybdenum (MO), or chromium (Cr), or an alloy such as aluminum (Al)-neodymium (Nd) alloys or molybdenum (MO)-tungsten (W) alloy.

The thin film transistor layer 210 also includes an interlayer insulating layer 214 on the gate 213. The interlayer insulating layer 214 may be formed by insulating an inorganic layer of silicon oxide or silicon nitride. In other optional embodiments, the interlayer insulating layer may be made of an organic insulating material.

The thin film transistor layer 210 also includes a source/drain layer 215 on the interlayer insulating layer 214, the source/drain layer 215 includes a source and a drain. The source and drain are electrically connected (or bonded) to a source region and a drain region respectively through contact holes formed by selectively removing the gate insulating layer 212 and the interlayer insulating layer 214.

The array substrate 120 may further include a passivation layer 216. Optionally, the passivation layer 216 is on a source electrode and a drain electrode of the thin film transistor 210. The passivation layer may be made of an inorganic material such as silicon oxide or silicon nitride or may be made of an organic material.

The array substrate 120 may further include a planarization layer 230. Optionally, the planarization layer 230 is on the passivation layer 215. The planarization layer 230 is made of an organic material such as acrylic, polyimide (PI) or benzocyclobutene (BCB). The planarization layer has a planarization function.

Optionally, the display panel 100 includes a plurality of pixels SP.

Optionally, a pixel of the plurality of pixels SP includes a light-emitting element 350.

Specifically, the display function layer 800 of the display panel 100 further includes a light-emitting function layer 300 on a side of the array substrate 120 away from the substrate 110. The light-emitting function layer 300 includes a plurality of light-emitting elements 350. Optionally, the light-emitting element is on a side of the array substrate away from the substrate. Optionally, the light-emitting function layer 300 is on the planarization layer 230. The light-emitting function layer 300 includes an anode layer 310, organic light-emitting materials 320 and a cathode layer 330 that are arranged in sequence along a direction away from the substrate 110.

Optionally, the light-emitting function layer 300 further includes a pixel definition layer 340 on a side of the anode layer 310 away from the array substrate 200. The pixel definition layer 340 may be made of an organic material such as polyimide (PI), polyamide, benzocyclobutene (BCB), acrylic resin or phenolic resin, or an inorganic material such as SiNx.

Optionally, the anode layer 310 includes a plurality of anode patterns corresponding to the plurality of pixels SP one-to-one. The anode patterns on the anode layer 310 are connected to the source electrode or the drain electrode of the thin film transistor 210 through via holes on the planarization layer 230. The pixel definition layer 340 is on a side of the anode layer 310 away from the substrate 110 and includes a plurality of openings exposing the anode layer 310. The pixel definition layer 340 covers edges of the patterns on the anode layer 310. The organic light-emitting materials 320 are at least partially filled in the openings of the pixel definition layer 340 and is in contact with the anode layer 310.

Optionally, the anode layer 310, the organic light-emitting materials 320 and the cathode layer 330 defined by each opening of the pixel definition layer 340 form a light-emitting element 350 (i.e., as shown in a dotted box in FIG. 2). Each light-emitting element 350 can emit lights of different colors according to different organic light-emitting materials 320. Each light-emitting element 350 constitutes a pixel SP (in other words, each light-emitting element 350 and a pixel circuit controlling the light-emitting element 350 together constitute a pixel). A plurality of pixels collectively displays a screen. It should be noted that a periphery of the pixel in the present specification refers to a periphery of the light-emitting element. That is, when an auxiliary structure mentioned below is positioned by a periphery of a pixel, a boundary of the pixel is defined by a boundary of a light-emitting element, and a periphery of the light-emitting element is the periphery of the pixel. In other words, an area where the pixel is located may be an area where an opening of the pixel definition layer for accommodating the light-emitting element is located, the boundary of the pixel is a boundary of the opening of the pixel definition layer, and the periphery of the pixel is a periphery of the opening of the pixel definition layer.

Optionally, the organic light-emitting materials 320 may be formed in the openings of the pixel definition layer 340 by means of inkjet printing, nozzle printing, or evaporation. The cathode layer 330 may be formed on the film layer where the organic light-emitting materials 320 are located by means of evaporation. Optionally, the cathode layer 330 may also cover entire surfaces of the organic light-emitting material 320 and the pixel definition layer 340.

Optionally, the display panel 100 further includes an encapsulation layer 400 on the light-emitting function layer 300 which completely covers the light-emitting function layer 300 to seal the light-emitting function layer 300. Some "on" mentioned in one embodiment can be understood as being on "a side away from the substrate". Optionally, the encapsulation layer 400 is a thin film encapsulation layer on the cathode layer 330, and includes a first inorganic encapsulation layer, a first organic encapsulation layer and a second inorganic encapsulation layer arranged in sequence along a direction away from the substrate 110. In other optional embodiments, the encapsulation layer may include any number of stacked organic materials and inorganic materials as required, but at least one layer of organic materials and at least one layer of inorganic materials are alternately deposited, and a lowermost layer and an uppermost layer are made of inorganic materials.

Optionally, the display panel further includes auxiliary structures 700 on a side of the display function layer 800 facing a display surface of the display panel 100.

Optionally, the auxiliary structures 700 are on a side of the encapsulation layer 400 away from the light-emitting function layer 300.

Optionally, the auxiliary structure 700 are around the pixels SP in the first display area AA1. Specifically, the auxiliary structures 700 are in the first display area AA1 and are around the light-emitting elements 350. Orthographic projections of the auxiliary structures 700 on the substrate 110 are around an orthographic projection of a light-emitting element 350 on the substrate 110. Optionally, an orthographic projection of an auxiliary structure 700 on the substrate 110 is between orthographic projections of two adjacent light-emitting elements 350 on the substrate 110. It can be understood that an edge of a light-emitting element 350 may be an edge of an opening of the pixel definition layer 340, i.e., the opening of the pixel definition layer 340 defines the light-emitting element 350.

Since a CUP area requires a higher light transmittance, there will be a visual difference from a conventional display area. In one embodiment, the auxiliary structures provided in the first display area can improve a visual difference between the CUP area and the conventional display area.

Further, because the light-transmitting area is around the light-emitting elements in the first display area, when the light-emitting elements in the first display area emit lights, a display effect in the first display area is different from a display effect in a conventional area. In one embodiment, the auxiliary structures are arranged on a side of the light-emitting elements facing the display surface of the display panel, and are arranged around the light-emitting elements with light-transmitting areas around the light-emitting elements, so that an influence of the light-transmitting areas around the light-emitting elements in the first display area on the light-emitting elements can be compensated, and the display difference of the light-emitting elements in the CUP area and the conventional display area can be improved.

It should be noted that, in the present specification, an auxiliary structure "around" a pixel means that the auxiliary structure is arranged adjacent to the pixel, and there may be a distance between the auxiliary structure and the pixel, but there are no other pixels or light-emitting elements between the auxiliary structure and the pixel.

In some embodiments, optionally, the auxiliary structure 700 includes a protrusion or a groove. The auxiliary structure 700 may be a protrusion or a groove. The auxiliary structure 700 may also be a combination of a protrusion and a groove.

Optionally, as shown in FIG. 2, the auxiliary structure 700 includes a protrusion. The protrusion may be an additional film layer structure. The protrusion may be an island-like structure. In some optional embodiments, the protrusion may be formed by an existing film layer in a certain display panel facing an outside of the film layer and extending along a direction perpendicular to the display panel (i.e., the third direction Z).

Optionally, in one embodiment, in the light-transmitting area SS, part of film layers or structures (e.g., pixel circuits) in the display panel need to be removed or be transferred to other areas, to increase a light transmittance of the first display area. Optionally, the insulating layer in the array substrate in the display panel is hollowed out in the light-transmitting area SS. Optionally, an entire surface of the substrate in the display panel is retained.

Optionally, the pixel circuits and TFTs corresponding to the pixels in the first display area are arranged in the non-first display area.

Optionally, the pixel circuits and TFTs corresponding to the pixels in the first display area are arranged in the second display area.

Figure 4:
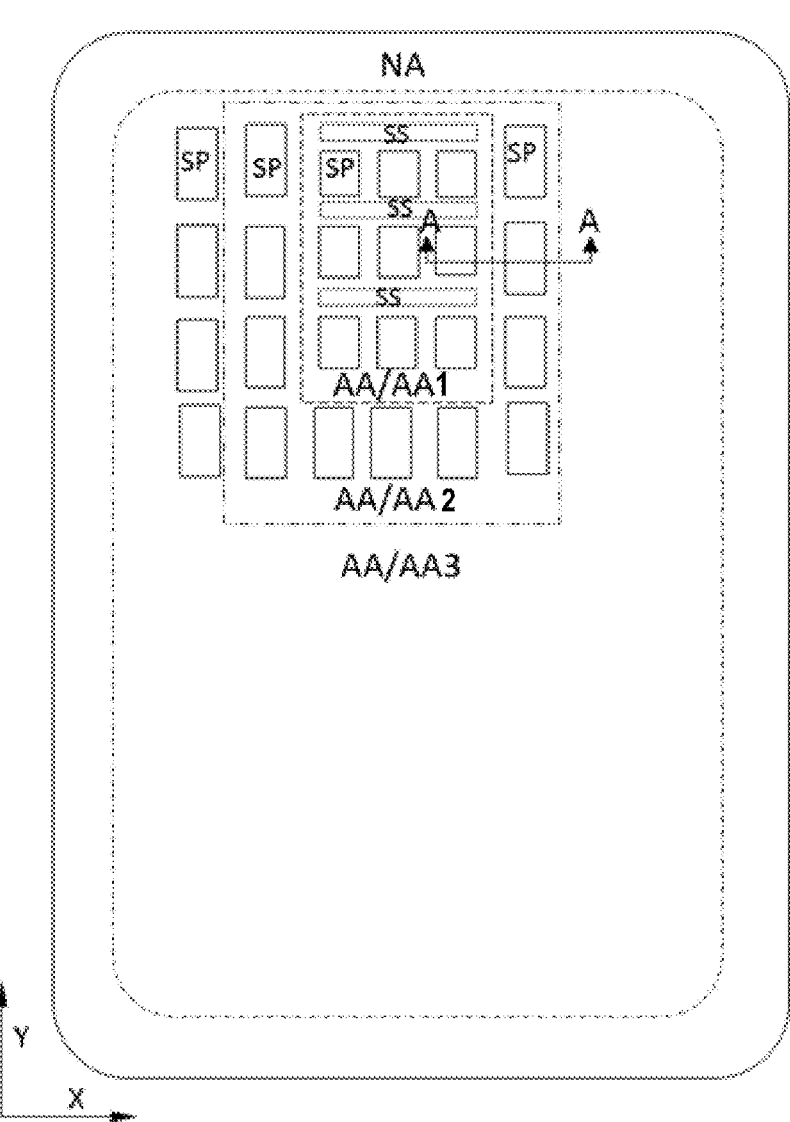
FIG. 4 illustrates a top view of another display panel consistent with various embodiments of the present disclosure.

FIG. 4 illustrates a top view of another display panel consistent with various embodiments of the present disclosure. In some optional embodiments, the display area AA of the display panel 100 may further include a third display area AA3, surrounding or partially surrounding the second display area AA2. For example, the third display area AA3 is between the non-display area NA and the second display area AA2.

The second display area AA2 is equivalent to a transition display area between a conventional display area and a light-transmitting display area (or the CUP area). Optionally, a pixel circuit corresponding to a light-emitting element in the third display area AA3 is in the display area where a pixel SP is located. A pixel circuit corresponding to a light-emitting element in the second display area AA2 is also in the display area where a pixel SP is located. The pixel circuit corresponding to the light-emitting elements in the first display area AA1 is in the second display area AA2, i.e., the second display area AA2 includes not only the pixel circuits corresponding to driving the light-emitting elements in the second display area AA2, but also the pixel circuits corresponding to driving the light-emitting elements in the first display area AA1.

It should be noted that, in FIGS. 1 and 2, a dotted box formed by double dot-lines is used to indicate a boundary between the second display area AA2 and the third display area AA3, a dotted box formed by short lines is used to indicate a boundary between the second display area AA2 and the first display area AA1 and a dotted box formed by dots is used to indicate a boundary of the light-transmitting area SS. Cross-sectional views in the accompanying drawings of the present specification applicable to the top view of FIG. 1, if not contradictory, can also be used to illustrate a partial cross-sectional view in the direction A-A in FIG. 4. Cross-sections are perpendicular to a plane where the display panel is located.

Figure 5:
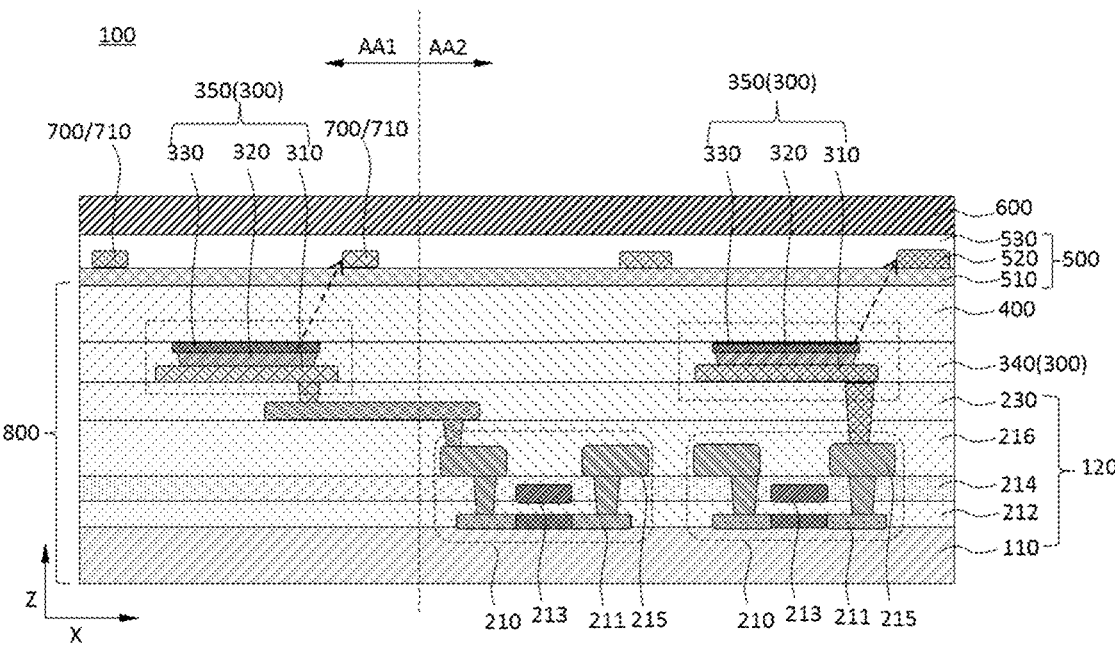
FIG. 5 illustrates another partial cross-sectional view along the A-A direction in FIG. 1.

FIG. 5 illustrates another partial cross-sectional view along the A-A direction in FIG. 1. The cross-section is perpendicular to the plane where the display panel is located. In one embodiment, the display panel further includes a touch function layer 500.

Optionally, the touch function layer 500 is on a side of the display function layer 800 facing the display panel 100.

Optionally, the touch function layer 500 is on the encapsulation layer 400 of the display panel 100, i.e., the touch function layer is on a side of the encapsulation layer away from the light-emitting elements.

Optionally, the auxiliary structure 700 is multiplexed as a film layer of the touch function layer 50, i.e., the auxiliary structure 700 and one or more film layers in the touch function layer 500 are on a same layer and are made of a same material.

At a large viewing angle, a brightness of the conventional display area is different from a brightness of the CUP area, resulting in the CUP area being visible. At a large viewing angle, an influence of some film patterns on a touch control layer on a light output of the conventional display area is different from an influence of some film patterns on a touch control layer on a light output of the CUP area. Therefore, at a large viewing angle, the brightness of the CUP area may be higher than the brightness of the conventional display area, resulting in the CUP area being visible.

In one embodiment, by arranging the auxiliary structure 700 and one or more film layers of the touch function layer 500 on a same layer and made of a same material, an influence of the auxiliary structures 700 on the light output of the CUP area can be closer to an influence of the touch function layer 500 on the light output of the conventional display area. The display effect described above can be improved, and at a same time, technical problems described above can be improved in a more targeted manner.

For example, dashed arrows in FIG. 5 illustrate lights at large viewing angles. Under a setting of the auxiliary structures, a difference between a light at a large viewing angle in the CUP area and a light at the large viewing angle in the conventional display area can be reduced.

There are differences in metal shadings or different refractive index structures on an optical path of a large viewing angle. Therefore, a concave-convex structure can be formed by arranging a same layer of metal as a TP (i.e., an auxiliary structure of multiplexing the metal mesh) or an insulating layer on a touch function layer above a light-transmitting area of the CUP, so that a light emitted at a large viewing angle of the CUP is also disturbed to reach a level equivalent to a normal area, i.e., the conventional display area. A brightness difference between the light-transmitting area of the CUP and the conventional display area is reduced at a large viewing angle.

Optionally, the display panel 100 further includes the second display area AA2. A light transmittance of the second display area AA2 is smaller than a light transmittance of the first display area AA1.

The touch function layer 500 includes conductive layers 520 at least in the first display area AA1.

The auxiliary structure 700 includes first auxiliary structures 710. A first auxiliary structure 710 and a conductive layer 520 are on a same layer and are made of a same material.

In one embodiment, the auxiliary structure can be formed by multiplexing a film layer where a conductive layer of a touch function layer is formed. On one hand, a conductive layer often needs to form a patterned conductive structure, so the conductive structure with conductive properties is often not arranged on an entire surface, which provides a certain setting spacing for the auxiliary structure; on the other hand, the auxiliary structure can be formed together with a pattering process of the conductive structure, thereby simplifying the process, and reducing a cost.

Figure 6:
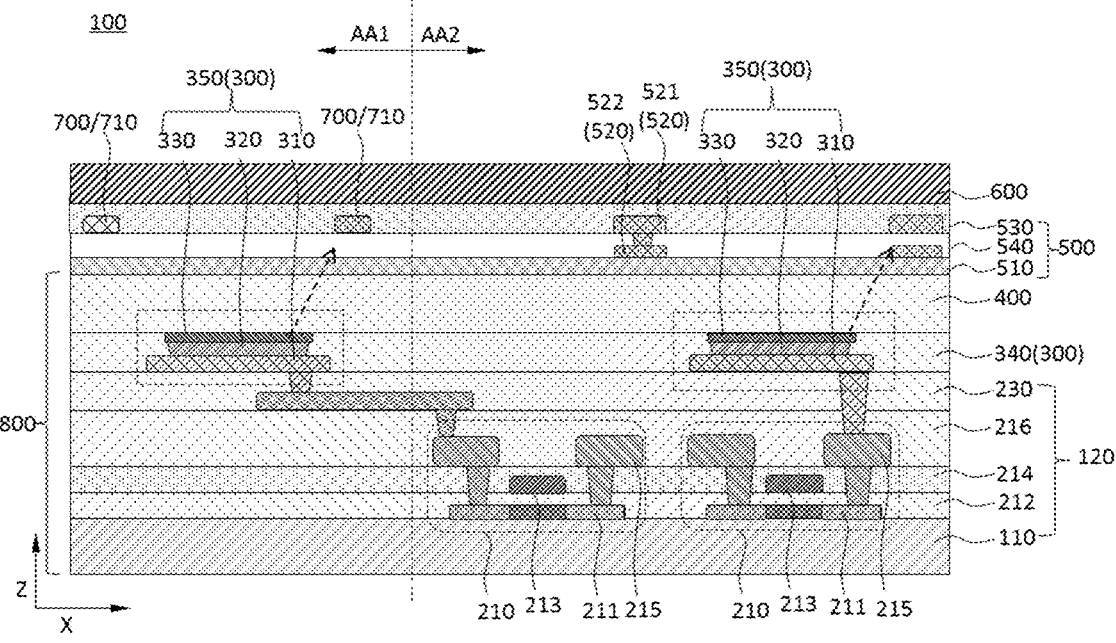
FIG. 6 illustrates another partial cross-sectional view along the A-A direction in FIG. 1.
Figure 7:
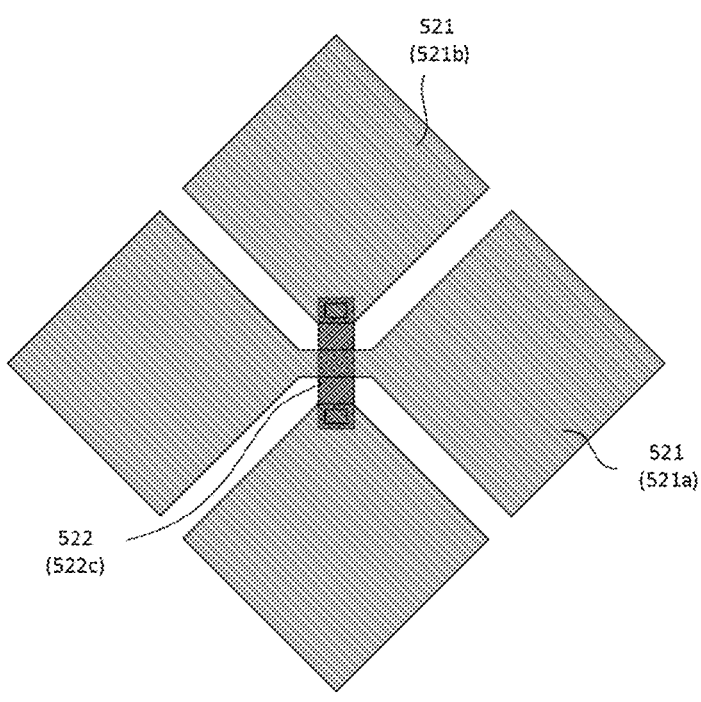
FIG. 7 illustrates a top view of a touch function layer consistent with various embodiments of the present disclosure.

FIG. 6 illustrates another partial cross-sectional view along the A-A direction in FIG. 1. FIG. 7 illustrates a top view of a touch function layer consistent with various embodiments of the present disclosure. The conductive layers 520 include a first touch conductive layer 521 and a second touch conductive layer 522. Optionally, a first auxiliary structure 710 and the first touch conductive layer 521 are on a same layer and are made of a same material; and/or a first auxiliary structure 710 and the second touch conductive layer 522 are on a same layer and are made of a same material.

Optionally, the conductive layer 520 includes an electrode layer and a bridge layer. The first auxiliary structure is on a same layer and are made of a same material as the electrode layer and/or the bridge layer.

Specifically, the first touch conductive layer 521 includes first touch electrodes 521a and second touch electrodes 521b, and one of the first touch electrode 521a and the second touch electrode 521b may be a touch driving electrode and the other of the first touch electrode 521a and the second touch electrode 521b may be a touch sensing electrode, so that the first touch electrode 521a is electrically insulated from the second touch electrode 521b.

Optionally, the first touch electrodes 521a intersect the second touch electrodes 521b. To achieve electrical isolations between the first touch electrodes 521a and the second touch electrodes 521b, parts of the second touch electrodes 521b on two sides of the first touch electrodes 521a may be electrically connected through bridge electrodes 522c on a different layer from the first touch conductive layer 521.

That is, the second touch conductive layer 522 includes the bridge electrodes 522c, and a position where a second touch electrode 521b intersects with a first touch electrode 521a is electrically connected through a bridge electrode 522c.

Optionally, the first auxiliary structure and one or more of the first touch electrodes 521a, the second touch electrodes 521b, and the bridge electrodes 522c are on a same layer and are made of a same material.

In some embodiments, as shown in FIG. 6, the first auxiliary structure and the first touch electrodes 521a and the second touch electrodes 521b are on a same layer and are made of a same material.

Figure 8:
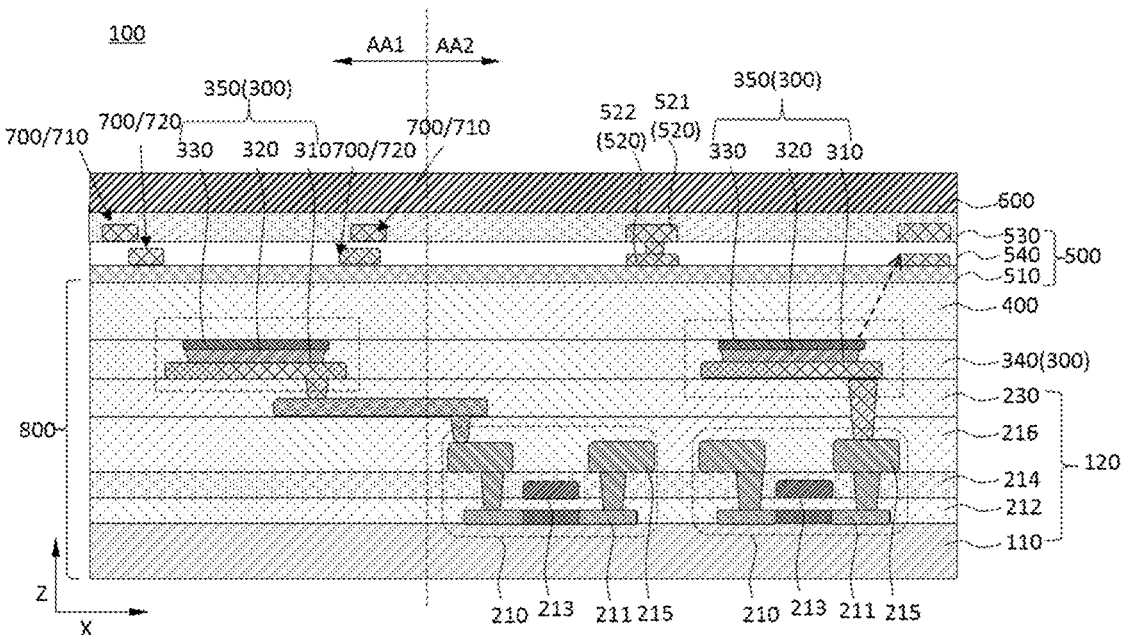
FIG. 8 illustrates another partial cross-sectional view along the A-A direction in FIG. 1.

FIG. 8 illustrates another partial cross-sectional view along the A-A direction in FIG. 1. The cross section is perpendicular to the plane where the display panel is located. Optionally, the first auxiliary structure includes a plurality of sublayers on different layers, a part of the first auxiliary structure is on a same layer and is made of a same material as the first touch electrodes 521a and the second touch electrodes 521b; and another part of the first auxiliary structure is on a same layer and is made of a same material as the bridge electrodes 522c.

Optionally, a touch function layer includes insulating layers. Specifically, when the display panel 100 includes the touch function layer 500, corresponding insulating layers are arranged to isolate the touch function layer 500 from other functional film layers, and/or corresponding insulating layers are arranged on the touch function layer 500 to separate conductive layers of different layers. In one embodiment, the insulating layers are referred to as touch insulating layers (refer to the first insulating layer 510, the second insulating layer 530 and the third insulating layer 540 in other embodiments). In one embodiment, the touch insulating layers in the second display area AA2 are retained and extended from the second display area AA2 to the first display area AA1. That is to say, the touch insulating layers are also retained in the first display area AA1.

Optionally, the first auxiliary structure may be carried by the touch insulating layers. The sublayers of the first auxiliary structure on different layers may be separated by the touch insulating layers.

It should be noted that, in one embodiment, a film layer where the electrode layer is located is the first touch conductive layer 521, and a film layer where the bridge layer is located is the second touch conductive layer 522. In other optional embodiments, the film layer where the electrode layer is located is the second touch conductive layer 522 and the film layer where the bridge layer is located is the first touch conductive layer 521.

In addition, in other technical solutions corresponding to the embodiment, the touch function layer 500 may only include one conductive layer. Optionally, when the touch function layer 500 includes only one conductive layer, the touch electrodes included therein are in a self-capacitance mode.

In the embodiment, on one hand, since the touch insulating layer is made of a light-transmitting material, appearing thereof in the first display area does not affect a light transmittance of the first display area. Moreover, since the touch insulating layer generally does not need patterning or complex patterning, the touch insulating layer is usually fabricated on an entire surface. However, the conductive layer of the touch function layer often needs to form electrodes or bridges, so patterning is required. In the embodiment, the touch insulating layer is retained in the CUP area, and the electrode layer or the film layer where the bridges are located is used as an auxiliary structure, which can make a touch structure of the CUP area and the conventional display area closer without affecting a light-transmitting area, thereby better improving a display difference between the CUP area and the conventional display area. On the other hand, the touch insulating layer can be used as an auxiliary structure to separate different sublayers, so that the auxiliary structure can simulate the touch structure and act on the CUP area through the multi-layer auxiliary structure with a better effect.

Figure 9:
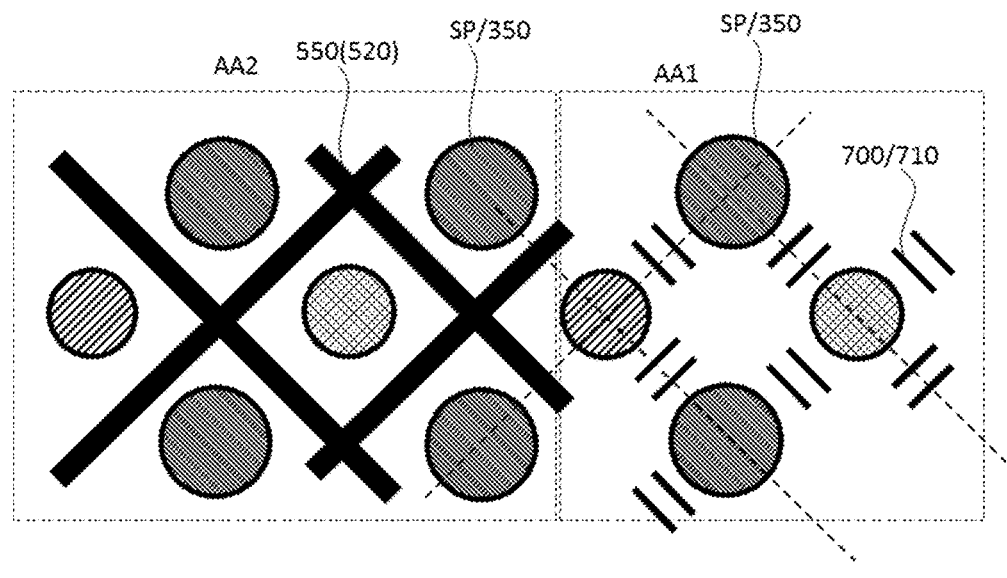
FIGS. 9-14 illustrate partially enlarged top views of several display panels consistent with various embodiments of the present disclosure.

FIG. 9 illustrates a partial enlarged plan view of another display panel consistent with various embodiments of the present disclosure. FIG. 9 should be understood together with the cross-sectional view of the touch function layer 500 in the present specification.

Optionally, the display panel 100 further includes a second display area AA2, and a light transmittance of the second display area AA2 is smaller than a light transmittance of the first display area AA1.

Optionally, the display panel further includes the touch function layer 500.

Optionally, the touch function layer 500 is on a side of the display function layer 800 facing the display panel of the display panel 100.

Optionally, the touch function layer 500 includes a metal mesh 550 in the second display area AA2, and mesh openings of the metal mesh 550 are arranged corresponding to the pixels SP.

Optionally, the metal mesh 550 may belong to one of the conductive layers of the touch function layer described in the above embodiments.

Optionally, the metal mesh forms the touch electrodes. That is, the metal mesh can be used to form the first touch electrodes 521*a* and the second touch electrodes 521*b* described in the above embodiments. Advantages of a metal mesh in touch control is that the metal mesh has low impedance (less than 10 ohms) and high flexibility, which can be used to realize a soft display panel and improve bending reliability.

Optionally, the auxiliary structures 700 include a first auxiliary structure 710, and the first auxiliary structure 710 and the metal mesh 550 are on a same layer and are made of a same material. That is, the first auxiliary structures 710 are also made of a metal material.

Optionally, the metal mesh 550 includes metal lines (or referred to as mesh lines) crossing each other.

Optionally, the metal lines are arranged in intervals of the pixels SP. The metal lines are arranged around the pixels or the light-emitting elements and do not block light outputs of the light-emitting elements from a front view angle.

Optionally, the first auxiliary structures 710 are metal line segments.

Although the metal lines are arranged around the pixels or the light-emitting elements, and do not block lights emitted from front views of the light-emitting elements, but the metal lines intercept or block lights emitted at large viewing angles. Because of material properties, a reflectivity of an area where the metal mesh is arranged in the display panel intersects is different from reflectivities of other areas.

In the embodiment, on one hand, the metal mesh can solve a soft problem; on the other hand, although the metal mesh introduces the above reflection problem in the embodiment, by simulating the metal mesh lines arranged in the CUP area through the auxiliary structures, a difference between the CUP area and the conventional display area can be further improved in a targeted manner; on the other hand, a light transmission effect and a display effect of the CUP area need to be coordinated, and the auxiliary structures can balance the light transmission effect and the display effect under a condition of a desired size, the above metal lines are formed when the metal mesh is formed, and the desired size (line width) of the metal line is closer to a desired size of the auxiliary structures.

The first auxiliary structures 710 surround the light-emitting elements 350 in a non-closed manner. That is, the light-emitting elements 350 in the first display area AA1 are not surrounded by metal lines in 360 degrees. The surrounding can be understood as an orthographic projection parallel to the plane where the display panel is located, which considers both a transparent display and the display effect.

Optionally, the first auxiliary structures 710 are metal line segments, and a plurality of the first auxiliary structures 710 may be arranged along a path surrounding the light-emitting elements 350.

In one embodiment, considering a coordination between the light transmission effect and the display effect of the CUP area, the auxiliary structure can balance the light transmission effect and the display effect when surrounding the light-emitting elements in a non-closed manner, thereby enlarging a marginal utility of the auxiliary structure.

A positional relationship of film layers on different layers described in the embodiment can be understood as a positional relationship of the orthographic projection on the plane where the display panel is located.

Figure 10:
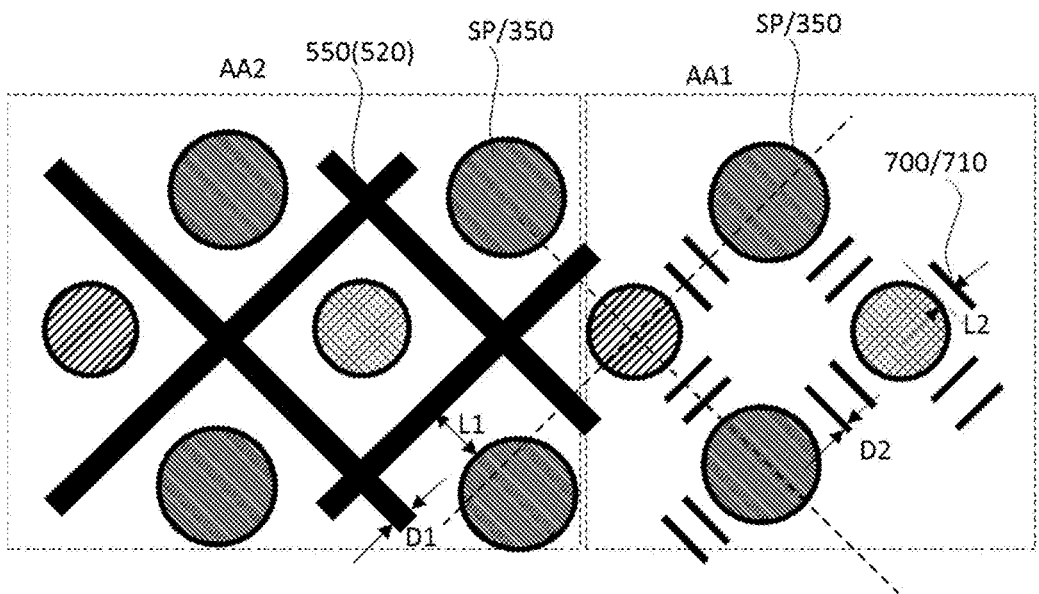

FIG. 10 illustrates a partial enlarged plan view of another display panel consistent with various embodiments of the present disclosure. FIG. 10 is understood together with the cross-sectional view of the touch function layer 500 in the present disclosure.

Optionally, a distance from a mesh line of the metal mesh 500 to a pixel SP adjacent thereto is L1. A distance from an auxiliary structure 700 to a pixel SP adjacent thereto is L2; and L1≥L2. Through the above design, on one hand, the auxiliary structure occupying a setting space of the light-transmitting area can be avoided. On the other hand, compared with the conventional display area, a problem of large viewing angle of the CUP area is not only affected by some structures in the touch function layer, which is different from the conventional display area, but also affected by other structures, thereby adding more problems caused by a display difference between the CUP area and the conventional display area. By arranging the first auxiliary structures closer to the light-emitting elements, compensations of the auxiliary structures can be strengthened, a difference caused by the touch structures and the above difference caused by other problems can be compensated, thereby further reducing the display difference between the CUP and the conventional display area.

Referring to FIG. 10, optionally, a width of a mesh line of the metal mesh 550 is D1, a width of an auxiliary structure 700 is D2, and D2≤D1. A dimension in a width direction perpendicular to an extending direction of the mesh line is the line width. The line width may be a distance from a side of the auxiliary structure close to the light-emitting element to a side of the auxiliary structure away from the light-emitting element. Considering the coordination between the light transmission effect and the display effect of the CUP area, through the design of the embodiment, the auxiliary structure occupying the setting space of the light-transmitting area can be avoided.

Optionally, number of mesh lines between two adjacent pixels SP in the second display area AA2 is smaller than number of auxiliary structures between two adjacent pixels SP in the first display area AA1.

Optionally, in one embodiment, when comparing numbers, a counting direction is an extension direction perpendicular to an auxiliary structure or a metal line, or a counting direction is a direction of a connecting line with a smallest distance between two adjacent pixels SP, that is, directions of dotted lines in FIG. 10.

For example, in FIG. 10, number of metal lines between two adjacent pixels in the first display area AA1 is two, and number of metal lines between two adjacent pixels in the second display area is one.

After transmittances are balanced, a uniformity of large-angle shadings needs to be considered. Therefore, in one embodiment, number of dummy TP patterns (i.e., auxiliary structures of multiplexing metal meshes) between the pixels in the CUP area is greater than or equal to number of TP graphics in the normal area, which can balance the light transmission effect and the display effect, thereby enlarging a marginal utility of the auxiliary structure.

Figure 11:
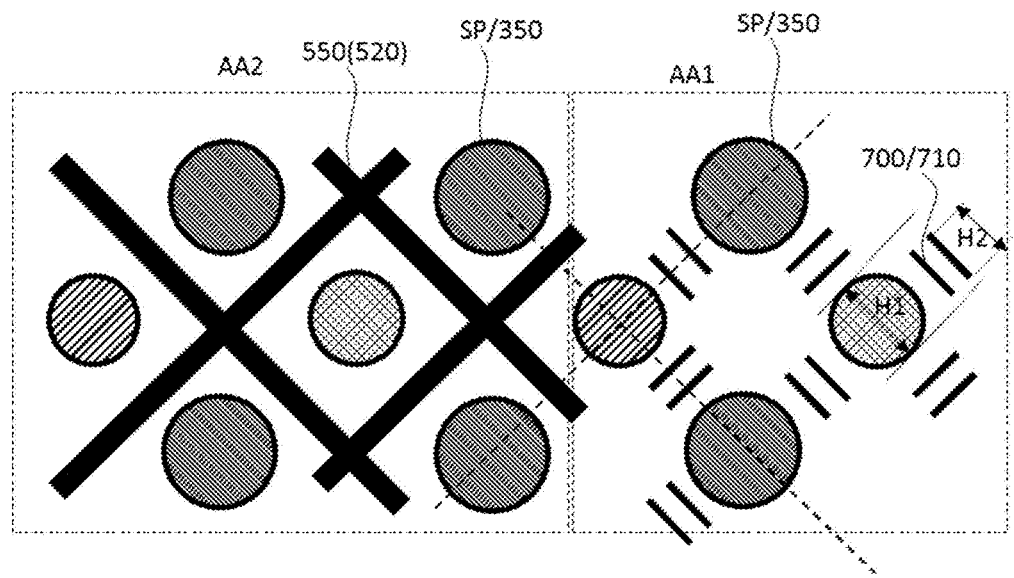
Figure 12:
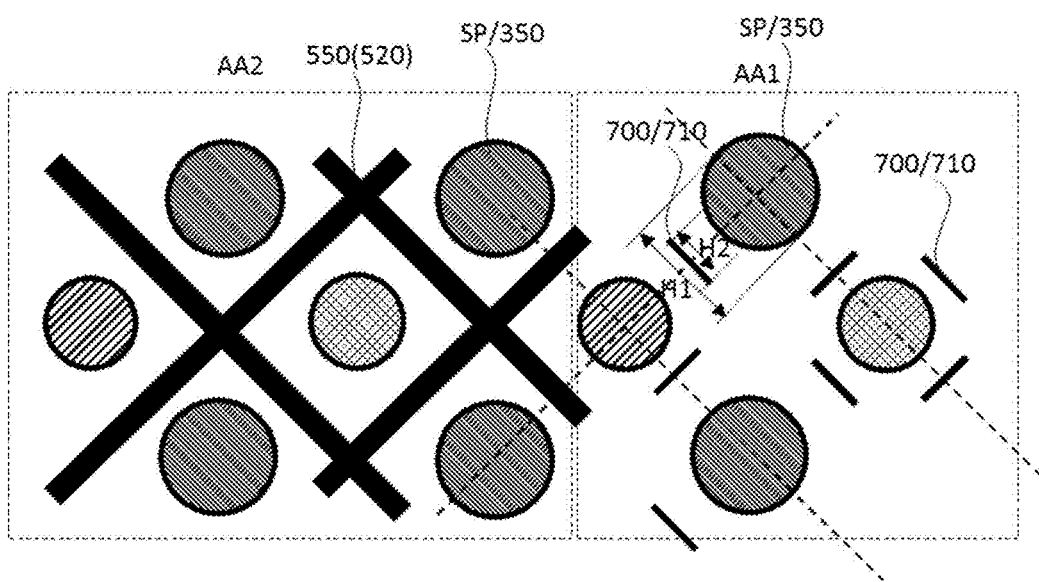

FIG. 11 and FIG. 12 are respectively partial enlarged top views of two other display panels consistent with various embodiments of the present disclosure. FIG. 11 or FIG. 12 is understood together with the cross-sectional view of the touch function layer 500 in the present disclosure. Optionally, a size of the auxiliary structure 700 is smaller than a size of the pixels SP adjacent thereto.

That is, in a direction parallel to the plane where the display panel is located, and perpendicular to a direction connecting the auxiliary structure 700 and the pixels SP adjacent thereto. A projection of the auxiliary structure 700 falls within a projection range of the pixels SP adjacent thereto. Specifically, in the direction parallel to the plane where the display panel is located, and perpendicular to the direction connecting the auxiliary structure 700 and the pixels SP adjacent thereto, a width of the auxiliary structure 700 is H2, a width of the pixels SP is H1, and H1≥H2.

The above design can make the auxiliary structures surround the pixels in a non-closed manner, which can prevent the auxiliary structures from connecting at pixel intervals, so that diagonal areas of the pixels have less influences on large-angle optical paths, and the transmittance and the display effect of the CUP are considered.

In addition, in some optional embodiments, referring to a top view of any of the first display areas in the present disclosure, the auxiliary structures are not arranged in the diagonal areas of the pixels, i.e., auxiliary structures are not arranged for areas surrounded by three or more pixels. For example, the pixels are arranged in arrays along a row direction and a column direction, and pixel spacings include a spacing extending along the row direction and a spacing extending along the column direction, and no auxiliary structures is arranged in an intersection area of the two types of spacing. The diagonal areas of the pixels can have less influences on the large-angle optical paths, so that the transmittance and the display effect of the CUP are considered.

In some other optional embodiments, a plurality of the auxiliary structures may be connected through transparent conductive structures and multiplexed as touch electrodes, which is not repeated herein.

Figure 13:
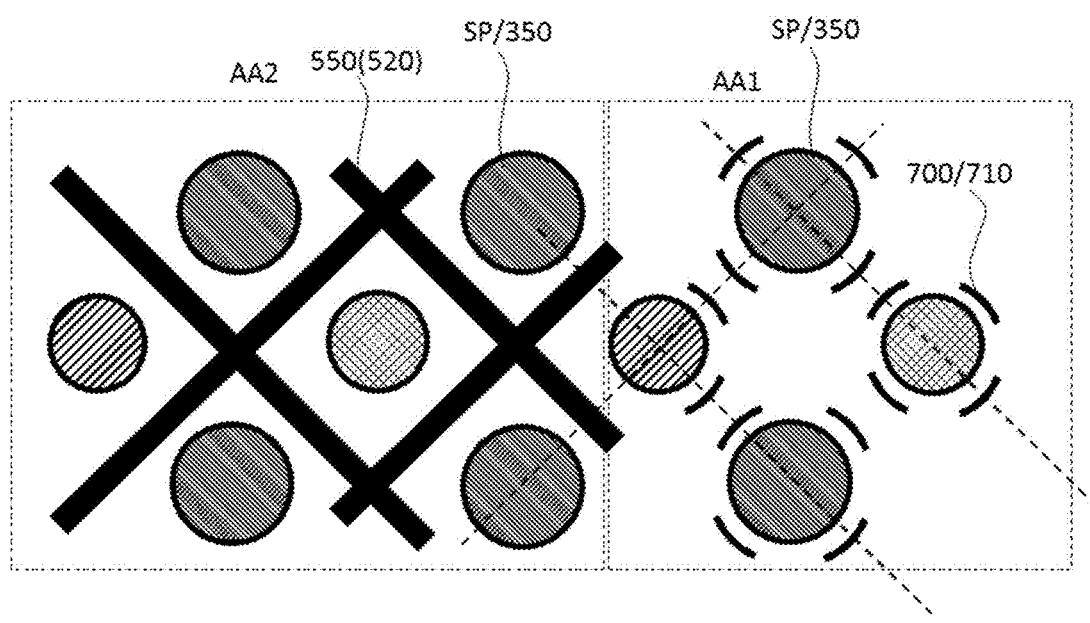

FIG. 13 illustrates a partial enlarged plan view of another display panel consistent with various embodiments of the present disclosure. FIG. 13 is understood together with the cross-sectional view of the touch function layer 500 in the present disclosure.

Optionally, the auxiliary structures 700 extends along at least part of edges of a pixel SP adjacent thereto.

That is, extension paths of the auxiliary structure 700 are parallel to the edges of the pixel SP adjacent thereto. In other words, a minimum distance from any point on a same auxiliary structure 700 to the pixel SP adjacent thereto is same.

Optionally, a plurality of the auxiliary structures 700 is arranged around a pixel SP.

Through the above design, the auxiliary structures can be extended to follow an outline of the pixel, and improvement effects are consistent in different orientations, so that viewing effects at large angles in different orientations do not make much difference.

Optionally, an auxiliary structure can also be a small arc of a non-straight line. An arc is conductive to reducing an influence on a transmittance of a high-transmittance area. It should be noted that a shape of the auxiliary structure herein refers to an extension path of the auxiliary structure, or a shape of an orthographic projection of the auxiliary structure on the plane where the display panel is located.

Optionally, arc-shaped auxiliary structures have different radians around the pixels SP of different sizes in the first display area AA1, to match opening areas of the pixels of different sizes.

In some embodiments, optionally, a distance from a mesh line of the metal mesh 500 to a pixel SP adjacent thereto is L1, a distance from an auxiliary structure 700 to a pixel SP adjacent thereto is L2, and L1=L2.

In some embodiments, reference is made to any of top views of the present specification relating to auxiliary structures. Optionally, a connecting line with a minimum distance between two adjacent pixels SP overlaps an auxiliary structure 700. A dashed line passing through the two adjacent pixels SP may represent a connecting line with a minimum distance between the two adjacent pixels SP. It can be understood that the connecting line is a virtual artificially defined line but not a solid structure.

Optionally, for pixels of a same color, a distance from a mesh line of the metal mesh 500 to a pixel SP adjacent thereto is L1, a distance from an auxiliary structure 700 to a pixel SP adjacent thereto is L2, and L1=L2.

Optionally, for pixels of different colors, a distance from a mesh line of the metal mesh 500 to a pixel SP adjacent thereto may be different from a distance from an auxiliary structure 700 to a pixel SP adjacent thereto.

In one embodiment, a dummy TP segmented metal pattern (i.e., an auxiliary structure of multiplexing the metal mesh) is arranging in a direction of a minimum spacing between opening areas of light-emitting pixels in the high-transmittance area of the CUP, so that a minimum distance between edges of a dummy metal pattern in the CUP area and opening areas of the pixels adjacent thereto of a specific color is same as a minimum distance between the TP metal edges in the normal area (i.e., the conventional display area) and opening areas of pixels of a same color.

A position and distance relationship of a matched auxiliary structures can be adjusted according to the pixels of different colors, and at a same time, the pixels of a same color can be kept as consistent as possible in the normal area and the CUP area. That is, the display effect of the CUP is compensated, and the pixels of a same color are also affected as consistently as possible.

For example, according to actual viewing angle biases and requirements, distances to the auxiliary structures that the pixels of different colors should match can be designed.

Optionally, a path of an auxiliary structure 700 intersects a path of the connecting line.

Optionally, the auxiliary structure 700 is symmetrical about the connecting line. Optionally, a size of the auxiliary structure 700 is smaller than sizes of pixels SP adjacent thereto. Through the above design, the auxiliary structures surround the pixels in a non-closed manner, so that the auxiliary structures can be prevented from being connected at pixel intervals, so that the transmittance and the display effect of the CUP can be considered. And it can be ensured that the auxiliary structures corresponding to a same pixel can be fully utilized instead of co-nesting around a same orientation of the same pixel.

Figure 14:
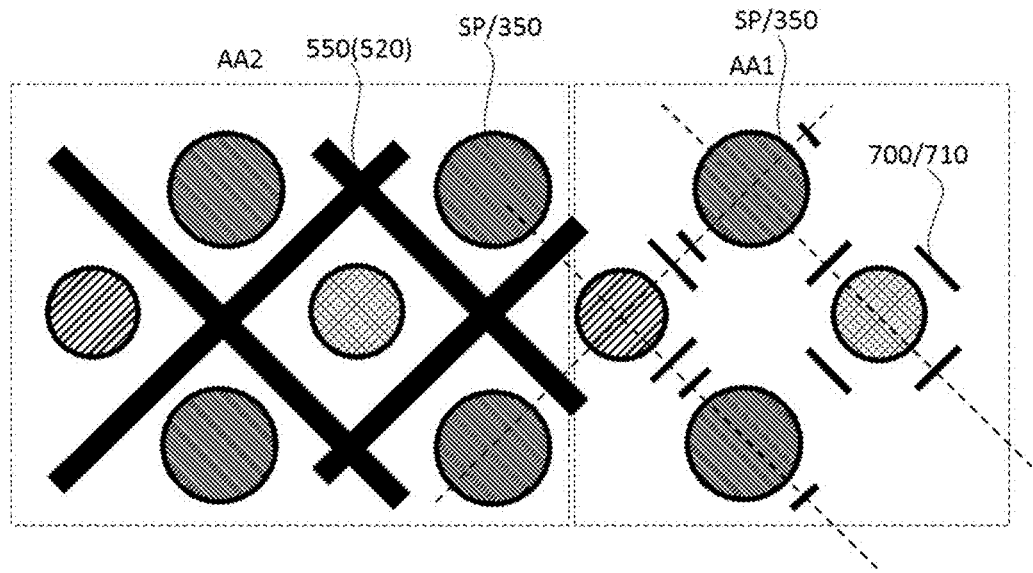

FIG. 14 illustrates a partial enlarged plan view of another display panel consistent with various embodiments of the present disclosure. FIG. 14 is understood together with the cross-sectional view of the touch function layer 500 in the present disclosure. Optionally, in the first display area AA1, arrangement conditions of the auxiliary structures 700 around at least two pixels are different.

The arrangement conditions may include that number of auxiliary structures 700, sizes and distances to the pixels SP adjacent to the auxiliary structures 700 are different.

In one embodiment, the auxiliary structures in different arrangement conditions can be arranged for different pixels, and light output effects for different pixels can be improved through the auxiliary structures.

Optionally, the pixels include at least one first pixel and at least one second pixel, and the first pixel and the second pixel are different in area and/or color.

Optionally, arrangements of the auxiliary structures around the first pixels are different from arrangements of the auxiliary structures around the second pixels. Numbers, sizes, and distances of the auxiliary structures around the first pixels and the auxiliary structures around the second pixels are different.

In some embodiments, in the first display area AA1, that is, in the high-transmittance area of the CUP, patterns, numbers and positions of the auxiliary structures may be different between different pixels. For example, at peripheries of some wavelength pixels that are insensitive to human eyes or have small emitting angles, no or less auxiliary structures may be provided, which is conductive to reducing an influence on transmittance.

Figure 15:
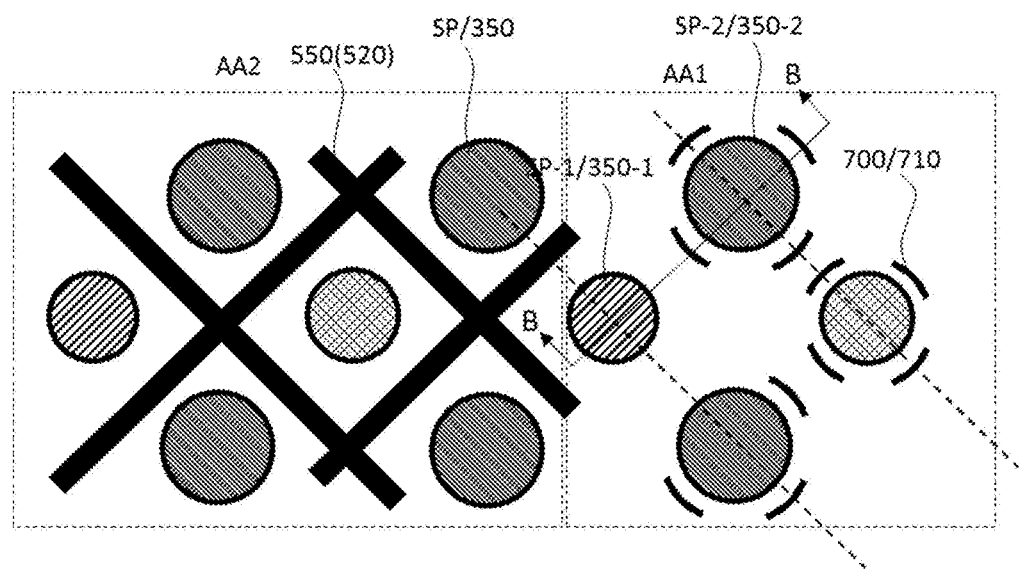
FIG. 15 illustrates a partially enlarged top view of another display panel consistent with various embodiments of the present disclosure.
Figure 16:
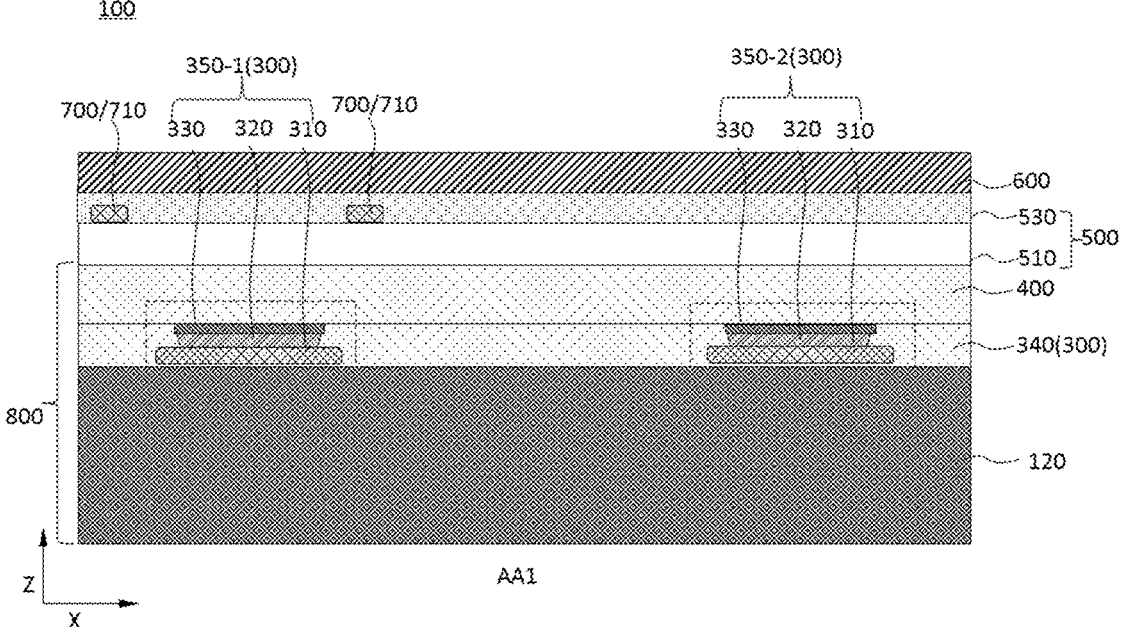
FIG. 16 illustrates a partial cross-sectional view along a B-B direction in FIG. 15.

FIG. 15 illustrates a partially enlarged top view of another display panel consistent with various embodiments of the present disclosure. FIG. 16 can be understood together with FIG. 15. FIG. 16 illustrates a partial cross-sectional view along a B-B direction in FIG. 15. The cross section is perpendicular to the plane where the display panel is located.

Optionally, the pixel SP includes at least one first pixel SP1 and at least one second pixel SP2, the first pixel SP1 includes a first light-emitting element 350-1, and the second pixel SP2 includes a second light-emitting element 350-2.

Optionally, no auxiliary structures are arranged around the first pixels SP1, and the auxiliary structures are arranged around the second pixels SP2.

Figure 17:
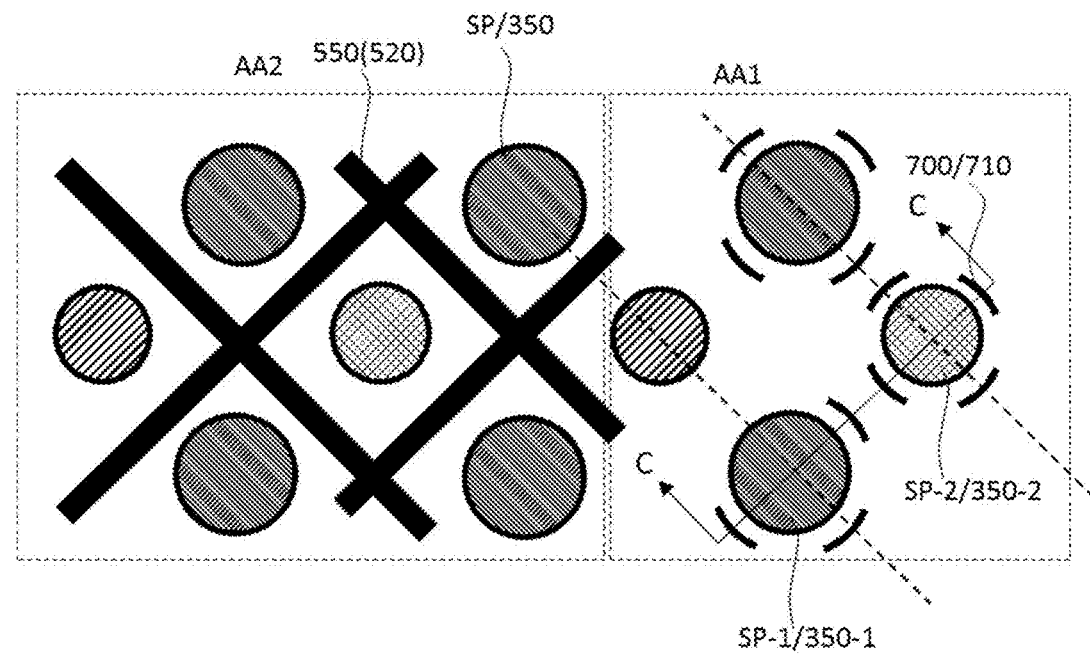
FIG. 17 illustrates a partially enlarged top view of another display panel consistent with various embodiments of the present disclosure.
Figure 18:
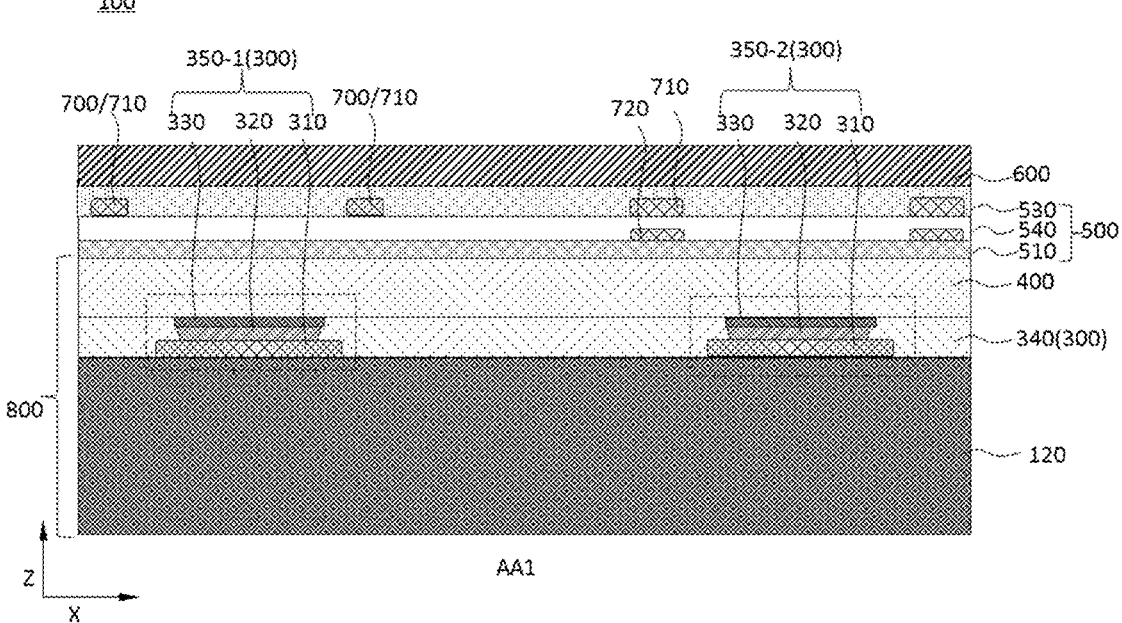
FIG. 18 illustrates a partial cross-sectional view along a C-C direction in FIG. 17.

FIG. 17 illustrates a partially enlarged top view of another display panel consistent with various embodiments of the present disclosure. FIG. 18 can be understood together with FIG. 17. FIG. 18 illustrates a partial cross-sectional view along a C-C direction in FIG. 17. The cross section is perpendicular to the plane where the display panel is located Different from the above embodiment, optionally, the pixels SP include at least one first pixel SP1 and at least one second pixel SP2, the first pixel SP1 includes a first light-emitting element 350-1, and the second pixel SP2 includes a second light-emitting element 350-2.

Optionally, the auxiliary structures around the first light-emitting element 350-1 (i.e., the first pixel SP1) have only one layer, and the auxiliary structures arranged around the second light-emitting element 350-2 (i.e., the second pixel SP2) have two sublayers.

Figure 19:
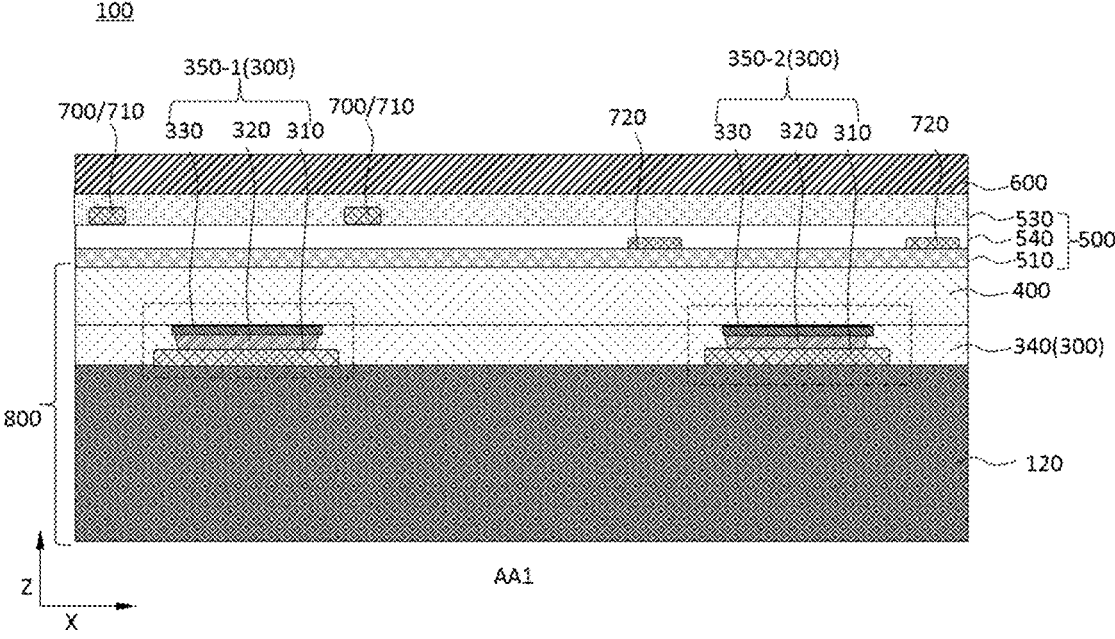
FIG. 19 illustrates another partial cross-sectional view along the C-C direction in FIG. 17.

FIG. 19 can be understood in conjunction with FIG. 17. FIG. 19 illustrates another partial cross-sectional view along the C-C direction in FIG. 17. The cross section is perpendicular to the plane where the display panel is located. The auxiliary structures 700 around different pixels SP are on different layers. Specifically, the pixels SP include at least one first pixel SP1 and at least one second pixel SP2, the auxiliary structures 700 around the first pixels SP1 and the auxiliary structures 700 around the second pixels SP2 are on different layers.

Optionally, the auxiliary structures 700 include first auxiliary structures 710 and second auxiliary structures 720 that are on different film layers. The first auxiliary structures 710 are arranged around the first pixels SP1, and the second auxiliary structures 720 are arranged around the second pixels SP2.

Optionally, the first auxiliary structures 710 and the first touch conductive layer 521 are on a same layer and are made of a same material; the second auxiliary structures 720 and the second touch conductive layer 522 are on a same layer and are made of a same material.

In some embodiments, the auxiliary structures may include a plurality of sublayers, and the auxiliary structures around different pixels are not completely on a same layer. That is, as shown in FIG. 18, some sublayers in the auxiliary structures around different pixels are arranged on different layers, and some sublayers in the auxiliary structures around different pixels are arranged on a same layer. The auxiliary structures around the first pixels and the second pixels all include sublayers on the first touch conductive layer 521, but only the auxiliary structures around the second pixels also include sublayers on the second touch conductive layer 522.

In some embodiments, for example, as shown in FIG. 8, FIG. 18 and FIG. 19, optionally, the auxiliary structures 700 includes first auxiliary structures 710 and second auxiliary structures 720 that are on different layers.

In one embodiment, positions of film layers corresponding to the auxiliary structures can be adjusted according to different pixels.

Optionally, the first auxiliary structures 710 are arranged around the first pixels SP1, and the second auxiliary structures 720 are arranged around the second pixels SP2.

Optionally, the auxiliary structures 700 are multiplexed as the conductive layer on the touch function layer 500.

Optionally, the first auxiliary structures 710 and the first touch conductive layer 521 are on a same layer and are made of a same material. The second auxiliary structures 720 and the second touch conductive layer 522 are on a same layer and are made of a same material.

That is, the touch function layer includes at least two sublayers. The first auxiliary structures and the second auxiliary structures are respectively on a same layer as different sublayers of the touch function layer.

Optionally, the first auxiliary structure 710 overlaps the second auxiliary structure 720. The overlap can be understood as an orthographic overlap of the first auxiliary structure 710 and the second auxiliary structure 720 on the plane where the display panel is located.

In other words, the auxiliary structures 700 include two sublayers that are the first auxiliary structures 710 and the second auxiliary structures 720 respectively. The first auxiliary structures 710 are on a different film layer from the second auxiliary structures 720. Optionally, the first auxiliary structures 710 and the second auxiliary structures 720 are simultaneously arranged around a same pixel.

In the embodiment, a thickness of the auxiliary structures can be increased when the above technical effect is considered. On one hand, an overlapping design can improve a difference in light output at large viewing angles, and at a same time, the overlapping design can also prevent the auxiliary structure from occupying a setting space of the light-transmitting area. On the other hand, compared with the conventional display area, a problem of large viewing angle of the CUP area is not only affected by some structures in the touch function layer, which is different from the conventional display area, but also affected by other structures, thereby adding more problems caused by the display difference between the CUP area and the conventional display area. By arranging the first auxiliary structures closer to the light-emitting elements, compensations of the auxiliary structures can be strengthened, a difference caused by the touch structures and the above difference caused by other problems can be compensated.

Optionally, the auxiliary structures 700 are multiplexed as the conductive layer in the touch function layer 500. Optionally, the first auxiliary structure 710 and the first conductive layer 521 are on a same layer and are made of a same material. The second auxiliary structure 720 and the second touch conductive layer 522 are on a same layer and are made of a same material. That is, the touch function layer includes at least two sublayers, and the first auxiliary structure and the second auxiliary structure are respectively on a same layer as different sublayers of the touch function layer. The above design can directly use an existing support and film material of the touch structure without adding film layers to elevate the auxiliary structure, and other advantages of the multiplexed touch function layer in the above embodiments can also be considered.

Figure 20:
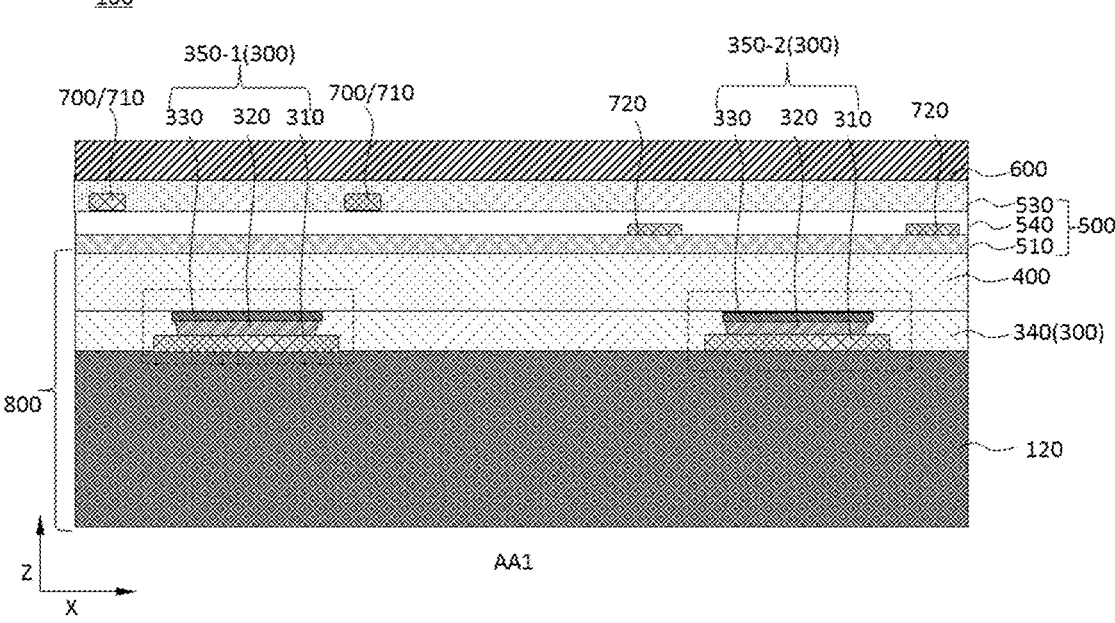
FIG. 20 illustrates a partially enlarged top view of another display panel consistent with various embodiments of the present disclosure.

FIG. 20 illustrates a partially enlarged top view of another display panel consistent with various embodiments of the present disclosure. FIG. 20 is understood together with the cross-sectional view of the touch function layer 500 in the present disclosure.

Optionally, the auxiliary structure 700 between two adjacent pixels SP is arranged symmetrically with respect to a mid-perpendicular line S of a connecting line between the two adjacent pixels SP. Through the above design, the auxiliary structure can be made to consider the above technical effects, and a graphics of the auxiliary structure can be arranged mirror-symmetrically about a pixel arrangement axis as much as possible, so that a viewing angle uniformity is better at different azimuth angles.

The "pixel arrangement axis" is a trajectory parallel to a pixel edge (tangent line) at a midpoint of a line of minimum spacing between adjacent pixel edges.

Figure 21:
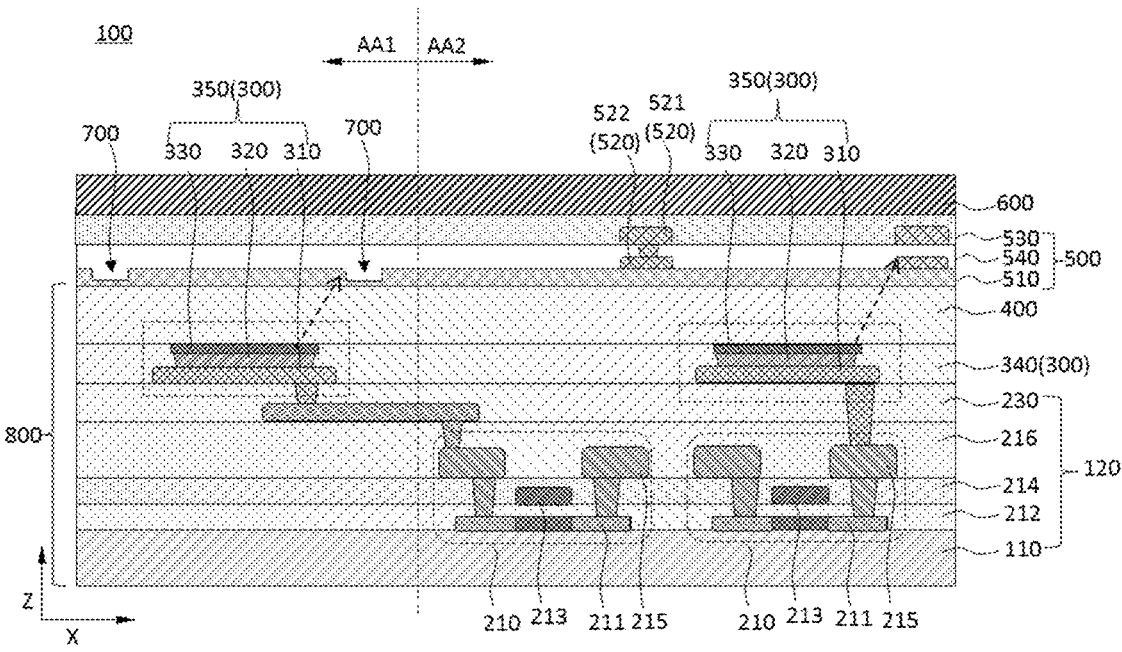
FIGS. 21-22 illustrate two other partial cross-sectional views along the A-A direction in FIG. 1.
Figure 22:
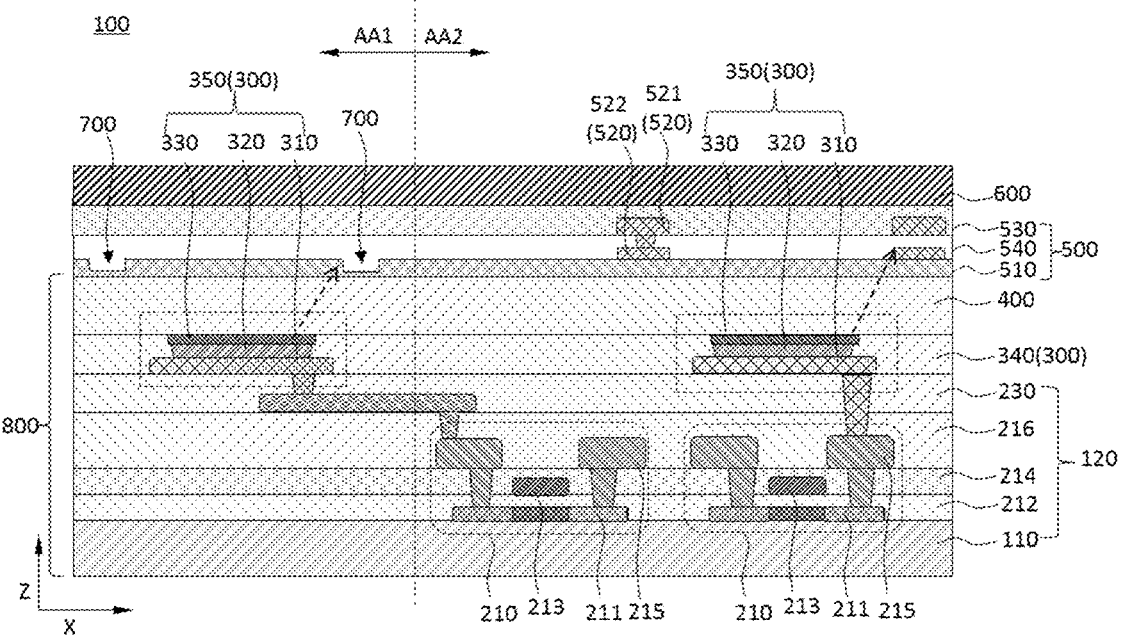

FIGS. 21-22 illustrate two other partial cross-sectional views along the A-A direction in FIG. 1. The cross section is perpendicular to the plane where the display panel is located.

Optionally, the touch function layer 500 includes at least one insulating layer. Specifically, when the display panel 100 includes the touch function layer 500, a corresponding insulating layer is provided to isolate the touch function layer 500 from other functional film layers, and/or corresponding insulating layers are arranged on the touch function layer 500 to separate the conductive layers of different layers. In one embodiment, the insulating layers are referred to as touch insulating layers (refer to the first insulating layer 510, the second insulating layer 530, and the third insulating layer 540 in other embodiments). In one embodiment, the touch insulating layer in the second display area AA2 is retained and extended from the second display area AA2 to the first display area AA1. That is, the touch insulating layer is also retained in the first display area AA1.

Optionally, the auxiliary structure is multiplexed as the insulating layer. Specifically, when the auxiliary structure is a groove, as shown in FIG. 21, the groove may be a groove formed by the touch insulating layer facing the inside of the film layer and extending along a direction perpendicular to the display panel (i.e., the third direction Z). Optionally, in some embodiments, the groove may be a hollow groove.

In one embodiment, the touch insulating layers in the first display area are retained, and the touch insulating layers form auxiliary layers of slotted structures. On one hand, a process of removing the touch insulating layer in the first display area is simplified, on the other hand, the addition of auxiliary film layers can be avoided to increase a thickness of the display panel. On the other hand, since the display panel includes at least two touch insulating layers, different depths of different groove structures can be realized by selecting number of the touch insulating layers with hollow portions.

When the auxiliary structure is a protrusion, as shown in FIG. 22, the protrusions may be protrusions formed by the touch insulating layer extending toward an outside of the film layer and along a direction perpendicular to the display panel (i.e., the third direction Z) toward a side away from the light-emitting element.

In one embodiment, the touch insulating layers in the first display area are retained, and the touch insulating layers form the auxiliary layers of slotted structures. On one hand, a process of removing the touch insulating layer in the first display area is simplified, on the other hand, the addition of auxiliary film layers can be avoided to increase a thickness of the display panel. On the other hand, since the display panel includes at least two touch insulating layers, a plurality of touch insulating layers of different layers can be selected to provide protrusions, and the protrusions can be stacked to achieve different thicknesses of different protrusion structures.

In some optional embodiments, the protruding auxiliary structure formed by the conductive layers of the touch function layer may overlap a protrusion formed by the touch insulating layer to increase a thickness of the auxiliary structure. A size of the auxiliary structure in the direction perpendicular to the plane where the display panel is located (the third direction Z) can have more choices, which can provide conditions for selecting auxiliary structures with suitable sizes according to needs of different pixels.

In some embodiments, reference may be made to the accompanying drawings of the above embodiments. Optionally, the auxiliary structures 700 surround the light-emitting elements 350 in a non-closed manner. That is, the light-emitting elements 350 in the first display area AA1 are not surrounded by the auxiliary structures 700 in 360 degrees. The surrounding can be understood as an orthographic projection on the plane parallel to the plane where the display panel is located, which considers the transparent display and the display effect.

Optionally, a plurality of auxiliary structures may be arranged along a path surrounding the light-emitting element 350.

Optionally, the auxiliary structure is an island-shaped structure, i.e., the auxiliary structure is a segment shape, a point shape, or a block shape.

In one embodiment, considering the coordination between the light transmission effect and the display effect of the CUP area, the auxiliary structure can balance the light transmission effect and the display effect when surrounding the light-emitting element in a non-closed manner, thereby enlarging a marginal utility of the auxiliary structure.

In some other optional embodiments, the auxiliary structures may be set to surround pixels in a closed manner or may be set to surround the light-emitting elements in a closed manner according to requirements, which will not be repeated herein.

In some embodiments, with reference to the accompanying drawings of the above embodiments, the display panel further includes an optical layer 600 on a side of the display function layer 800 facing the display surface of the display panel.

Optionally, the optical layer 600 is a polarizer.

Optionally, the touch function layer may include a third insulating layer 540 between the first touch conductive layer 521 and the second touch conductive layer 522 and a second insulating layer 530 on a side of the first touch conductive layer 521 facing the display surface of the display panel.

Optionally, the third insulating layer 540 is an inorganic insulating layer, and the second insulating layer 530 is a TPOC layer. When the optical layer 600 is a polarizer POL, an organic TPOC material is mainly used.

In some embodiments, the touch function layer may include a first insulating layer 510 on a side of the second touch conductive layer 522 away from the display surface of the display panel. The first insulating layer 510 may be a barrier layer, i.e., a TP-buffer.

In some embodiments, optionally, the display function layer includes a light shielding layer.

Optionally, the optical layer 600 may be a color filter substrate.

Optionally, the color filter substrate includes a light shielding layer, and the auxiliary structure intersects and overlaps the light shielding layer.

In other optional embodiments, the array substrate includes a light shielding layer or a metal layer; the metal layer or the light shielding layer overlaps with the auxiliary structure. Optionally, the metal layer may be a conductive layer in the pixel circuit. For example, the metal layer and the source and drain layers of the thin film transistor are on a same layer and are made of a same material.

Through the above design, a pattern of the auxiliary structure in the high-transmittance area of the CUP overlaps a projection of an opaque film layer of an array below as much as possible to reduce an influence on transmittance.

Figure 23:
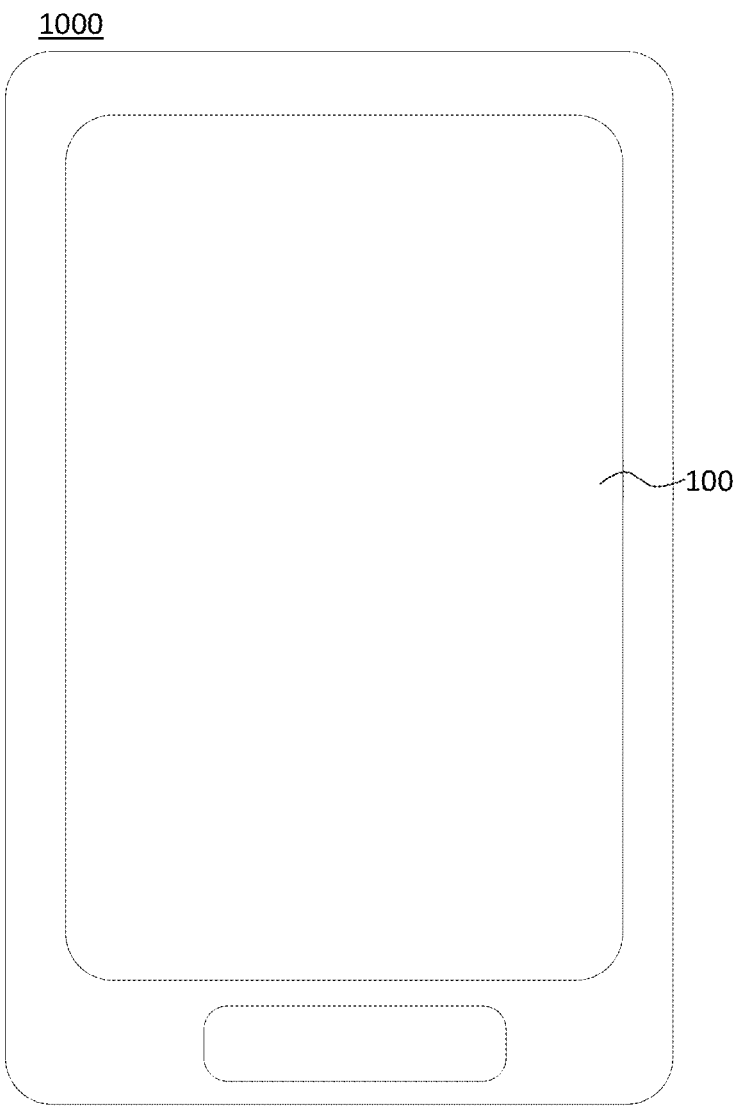
FIG. 23 illustrates a schematic diagram of a display device consistent with various embodiments of the present disclosure.

The present disclosure also provides a display device including the display panel provided by the present disclosure. FIG. 23 illustrates a schematic diagram of a display device consistent with various embodiments of the present disclosure. A display device 1000 includes the display panel 100 provided by any of the above embodiments. One embodiment of FIG. 23 only takes a mobile phone as an example to describe the display device 1000. It can be understood that the display device provided by the embodiment of the present disclosure may be a computer, a TV, a vehicle-mounted display device, or another display device with a display function, which is not specifically limited herein. The display device provided by the embodiment has beneficial effects of the display panel provided by the embodiments. For details, references may be made to specific descriptions of the display panel in the above embodiments.

As disclosed, the display panel and the display device provided by the present disclosure achieve at least the following beneficial effects.

The display panel includes the auxiliary structures. by arranging the auxiliary structure and one or more film layers in the touch function layer on a same layer and made of a same material, an influence of the auxiliary structures on the light output of the CUP area can be closer to an influence of the touch function layer on the light output of the conventional display area, thereby improving the display effect. The auxiliary structures surround the light-emitting elements 350 in a non-closed manner. The surrounding can be understood as an orthographic projection parallel to the plane where the display panel is located, which considers both the transparent display and the display effect.

The above content is a further detailed description of the present disclosure in conjunction with specific preferred embodiments and cannot be considered that the specific implementations of the present disclosure are limited to the description. For a person skilled in the art, without departing from the concept of the present disclosure, some simple deductions or substitutions can be made, which should be regarded as belonging to the protection scope of the present disclosure.

What is claimed is:

1. A display panel, comprising:
a first display area corresponding to an area for arranging optical sensing elements under the display panel through camera under panel (CUP) technology, the first display area having a plurality of light-transmitting areas, wherein the display panel further comprises:
a display function layer including light-emitting elements;
auxiliary structures on a side of the display function layer facing a display surface of the display panel; and
the auxiliary structures configured around pixels in the first display area, wherein in the first display area:
pixel circuits for pixels included in an inner part of the first display area are arranged in an area outside the first display area along a direction perpendicular to the display surface, and no pixel circuit for pixels included in the first display area overlaps with an optical sensing element in the first display area, and
the plurality of light-transmitting areas are configured adjacent to the pixels to transmit external light through the first display area and further into a backside of the display panel where the optical sensing elements are disposed.

2. The display panel according to claim 1, wherein an auxiliary structure includes a protrusion or a groove.

3. The display panel according to claim 2, further comprising:
a touch function layer on a side of the display function layer facing the display surface of the display panel; wherein
the auxiliary structure is multiplexed as a film layer in the touch function layer.

4. The display panel according to claim 3, further comprising a second display area, wherein:
a light transmittance of the second display area is smaller than a light transmittance of the first display area;
the touch function layer includes conductive layers at least in the first display area; and
the auxiliary structures include first auxiliary structures on a same layer and being made of a same material as a conductive layer.

5. The display panel according to claim 4, wherein the conductive layer includes a touch electrode layer and a bridge layer, and the first auxiliary structures are on a same layer and are made of a same material as the touch electrode layer and/or the bridge layer.

6. The display panel according to claim 1, further comprising a second display area, wherein:

a light transmittance of the second display area is smaller than a light transmittance of the first display area;

the display panel further includes a touch function layer on the side of the display function layer facing the display surface of the display panel; and the touch function layer includes a metal mesh in the second display area, mesh openings of the metal mesh are arranged corresponding to the pixels.

7. The display panel according to claim 6, wherein the auxiliary structures include first auxiliary structures, and the first auxiliary structures are on a same layer and are made of a same material as the metal mesh.

8. The display panel according to claim 7, wherein:

a line width of a mesh line of the metal mesh is D1;

a width of an auxiliary structure is D2; and

D2≤D1.

9. The display panel according to claim 6, wherein number of mesh lines between two adjacent pixels in the second display area is smaller than number of the auxiliary structures between two adjacent pixels in the first display area.

10. The display panel according to claim 9, wherein:

a distance between a mesh line of the metal mesh and a pixel adjacent thereto is L1;

a distance between an auxiliary structure and a pixel adjacent thereto is L2; and

L1>L2.

11. The display panel according to claim 1, wherein a size of an auxiliary structure is smaller than a size of a pixel adjacent to the auxiliary structure.

12. The display panel according to claim 1, wherein an auxiliary structure extends along at least part of edges of a pixel adjacent to the auxiliary structure.

13. The display panel according to claim 1, wherein in the first display area, the auxiliary structures configured around at least two pixels are arranged differently.

14. The display panel according to claim 6, wherein the touch function layer includes at least one insulating layer, and an auxiliary structure is multiplexed as an insulating layer.

15. The display panel according to claim 14, wherein the auxiliary structure includes a first auxiliary structure and a second auxiliary structure, and the first auxiliary structure and the second auxiliary structure are on different layers.

16. The display panel according to claim 15, wherein the first auxiliary structure overlaps the second auxiliary structure.

17. The display panel according to claim 1, wherein an auxiliary structure between two adjacent pixels is symmetrically arranged with respect to a mid-perpendicular line of a connecting line between the two adjacent pixels.

18. The display panel according to claim 1, wherein a connecting line with a smallest distance between two adjacent pixels overlaps an auxiliary structure, and/or the auxiliary structures are configured surrounding the pixels in a non-closed manner.

19. The display panel according to claim 1, wherein a second pixel outside the first display area has a corresponding second pixel circuit configured overlapping with the second pixel along the direction perpendicular to the display surface, and each of the first and second pixel circuits includes a thin film transistor.

20. A display device, comprising a display panel comprising a first display area corresponding to an area for arranging all optical sensing elements under the display panel through camera under panel (CUP) technology, the first display area having a plurality of light-transmitting areas, wherein the display panel further comprises:

a display function layer including light-emitting elements;

auxiliary structures on a side of the display function layer facing a display surface of the display panel; and the auxiliary structures configured around pixels in the first display area, wherein in the first display area:

pixel circuits for pixels included in an inner part of the first display area are arranged in an area outside the first display area along a direction perpendicular to the display surface, and no pixel circuit for pixels included in the first display area overlaps with an optical sensing element in the first display area, and the plurality of light-transmitting areas are configured adjacent to the pixels to transmit external light through the first display area and further into a backside of the display panel where the optical sensing elements are disposed.

* * * * *